United States Patent [19]

Comfort et al.

[11] Patent Number: 4,807,161
[45] Date of Patent: Feb. 21, 1989

[54] AUTOMATIC TEST EQUIPMENT

[75] Inventors: John J. Comfort; Paul A. Hayter, both of Berkshire; Dinesh Kargathra, Middlesex; Brian R. Mason; Graham N. Turner, both of Berkshire; Ian R. Fisher, Middlesex; John W. Bailey, Berkshire, all of England

[73] Assignee: Mars Incorporated, McLean, Va.

[21] Appl. No.: 140,895

[22] Filed: Dec. 29, 1987

Related U.S. Application Data

[63] Continuation of Ser. No. 674,559, Nov. 26, 1984, abandoned.

[30] Foreign Application Priority Data

Nov. 25, 1983 [GB] United Kingdom ................ 8331558
Apr. 16, 1984 [GB] United Kingdom ................ 8409794

[51] Int. Cl.⁴ .......................................... G06F 11/00
[52] U.S. Cl. .............................. 364/550; 324/73 AT; 364/571.01
[58] Field of Search ............... 364/550, 551, 709, 579, 364/571; 324/73 PC, 73 AT

[56] References Cited

U.S. PATENT DOCUMENTS

| | | | |
|---|---|---|---|
| 4,385,366 | 5/1983 | Housey, Jr. ...................... | 364/709 X |
| 4,402,055 | 8/1983 | Lloyd et al. ................ | 324/73 AT X |
| 4,517,512 | 5/1985 | Petrich et al. .............. | 324/73 AT X |
| 4,517,661 | 5/1985 | Graf et al. ................... | 324/73 PC X |
| 4,549,279 | 10/1985 | Lapeyre ............................. | 364/709 |
| 4,567,567 | 1/1986 | Lapeyre ............................. | 364/709 |

Primary Examiner—Gary V. Harkcom
Assistant Examiner—H. R. Herndon
Attorney, Agent, or Firm—Davis Hoxie Faithfull & Hapgood

[57] ABSTRACT

An automatic test equipment for the functional testing of electrical printed circuit board assemblies is constructed as the combination of a programmable controller based upon a microcomputer and selected interface modules which can be plugged into the controller system backplane in any of a number of module interconnection locations and in any combination of module types with the controller being adapted to interrogate the modules as to their type and location and organize its routines accordingly. The controller has an advantageous bus structure for resource sharing within the equipment, and provides facilities for various forms of input/output modules as well as for analog stimulus/response modules, programmable waveform generator modules, signature analysis and frequency measurement modules, real time emulation modules, etc., and for the connection of computer standard utilities such as keyboard, light-pen graphics, printer, etc., as well as specialist instrumentation and also a manufacturing defects analyzer for in-circuit testing.

49 Claims, 18 Drawing Sheets

CONTROLLER BLOCK DIAGRAM

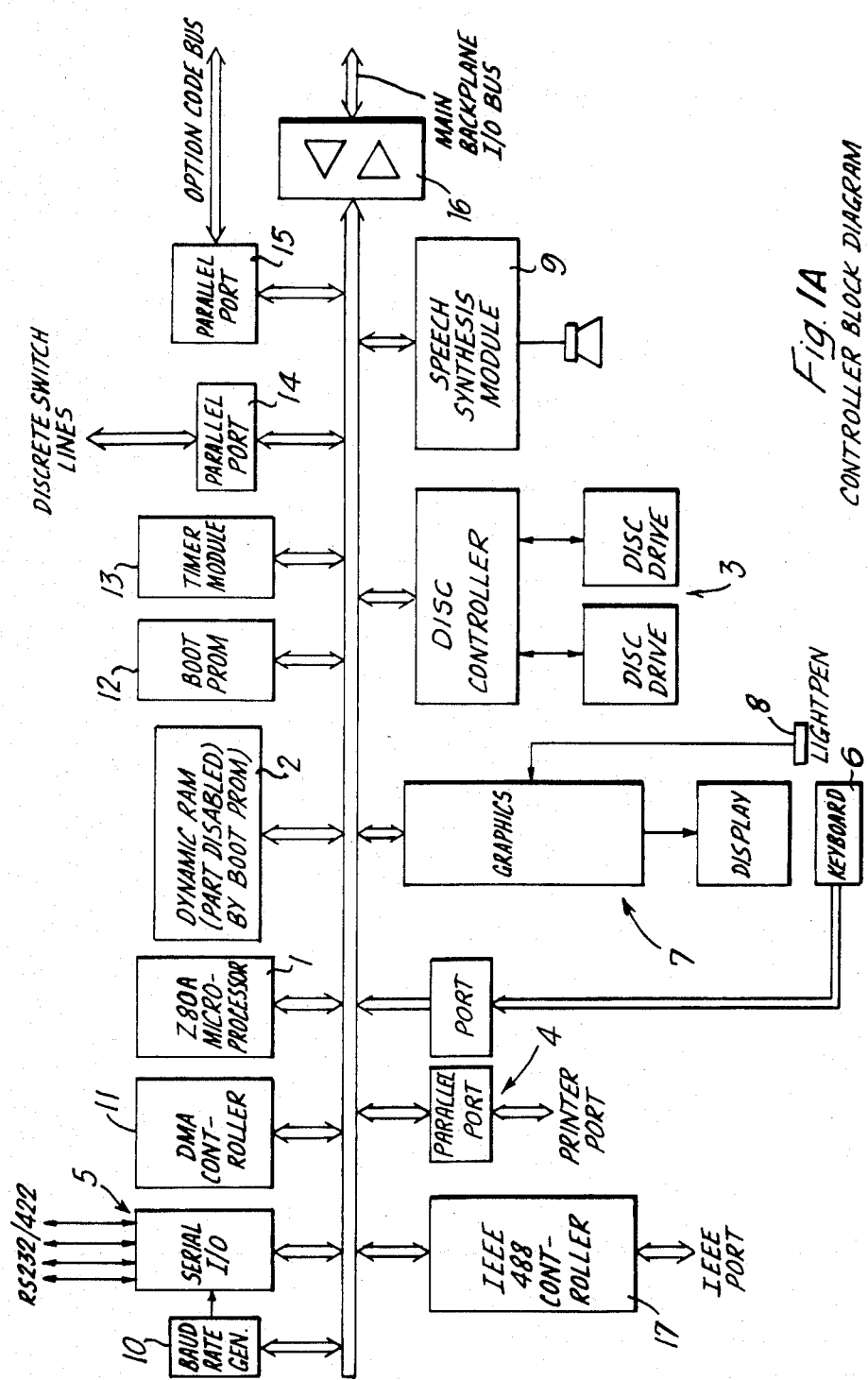

INTERFACE BLOCK DIAGRAM

SYNC GENERATION CIRCUIT

FUNCTION GENERATOR
BLOCK DIAGRAM

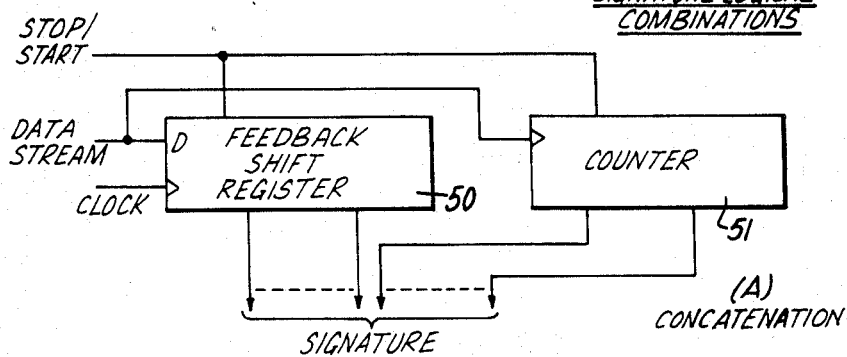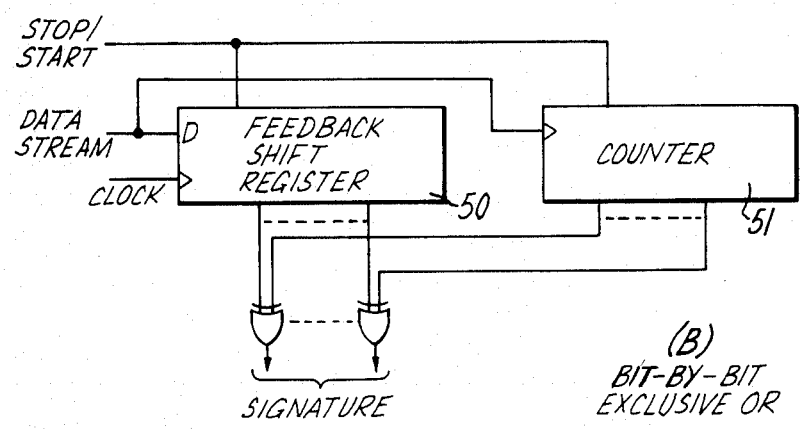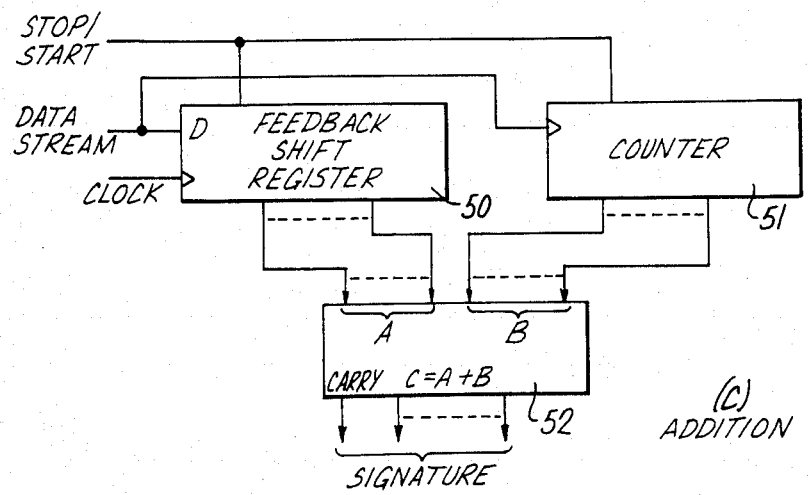
Fig.5.
SIGNATURE LOGICAL COMBINATIONS

MINIMAL COMPLEXITY SIGNATURE ANALYSIS SHIFT REGISTERS

DRIFT DETECTION

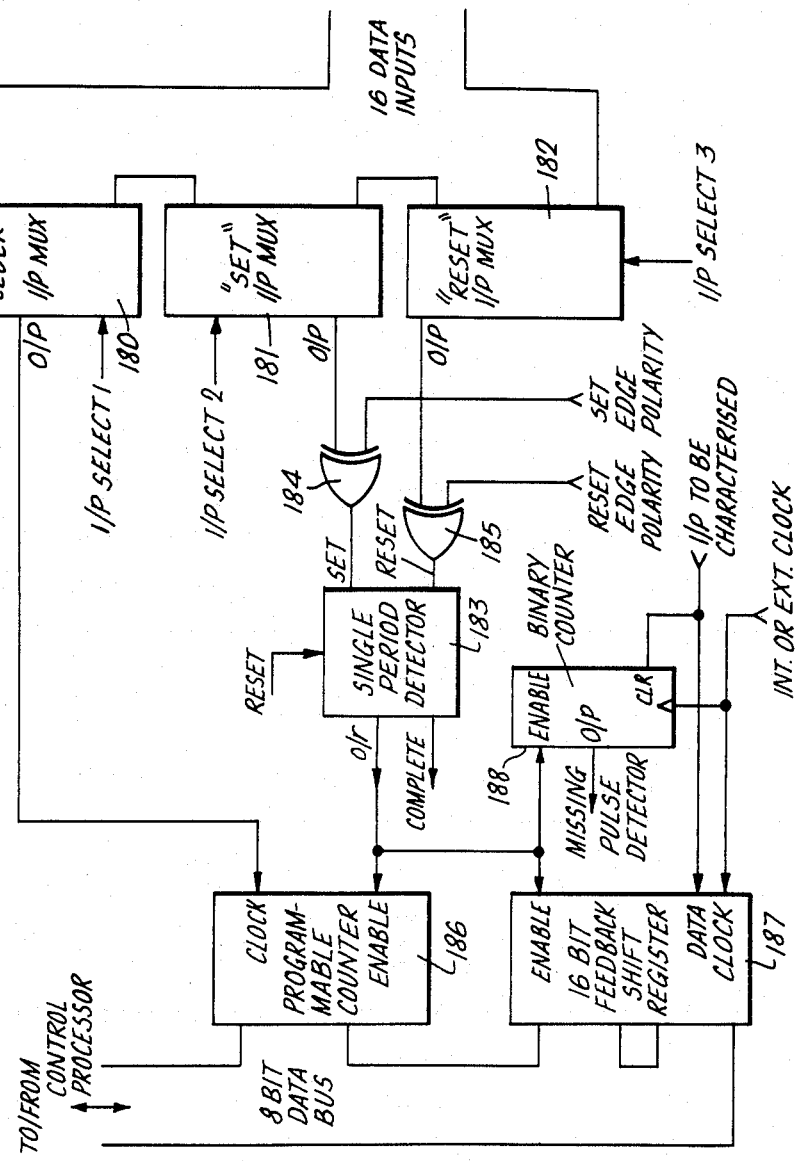

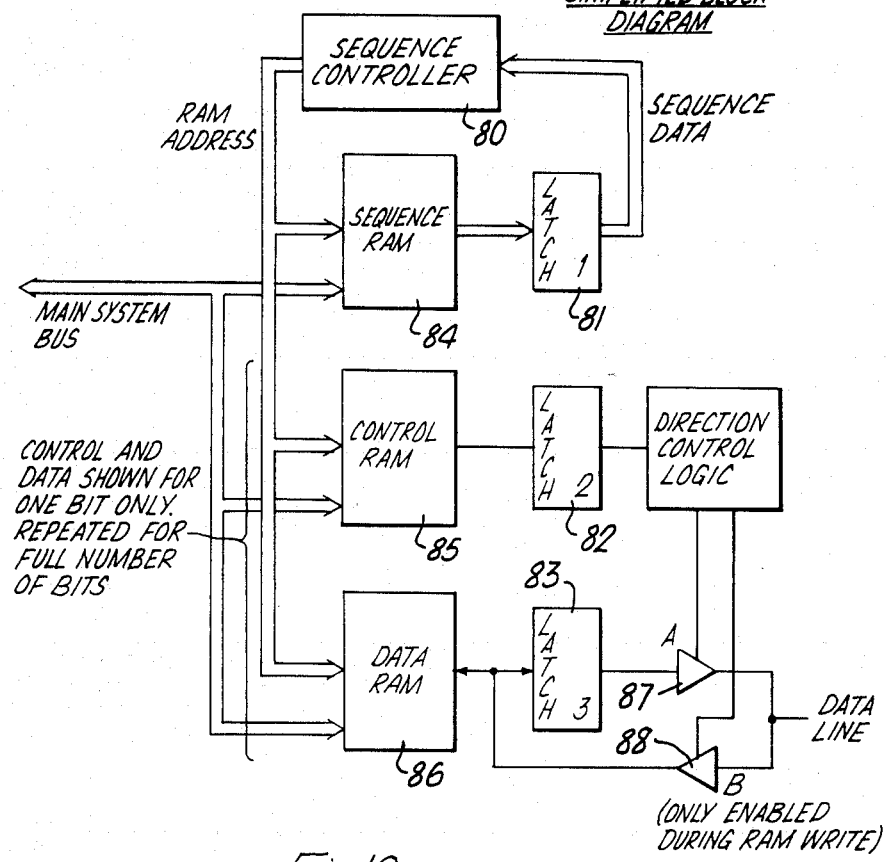
Fig. 9. SIMPLIFIED BLOCK DIAGRAM
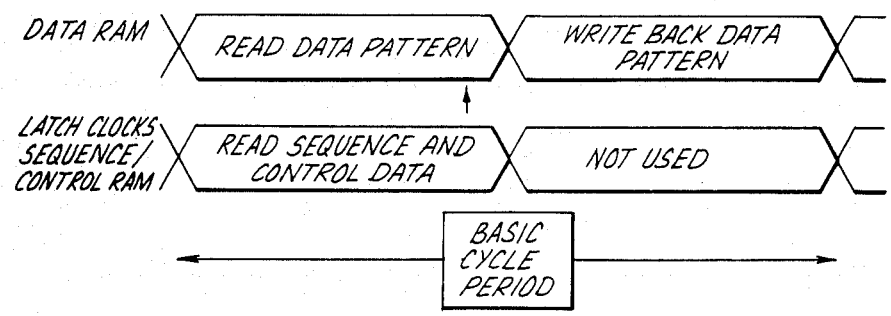
Fig. 10. EMULATOR CYCLE TIME

GENERAL ARRANGEMENT FOR EMULATION

MASTER EMULATOR

SLAVE EMULATOR

ACTIVE JIG

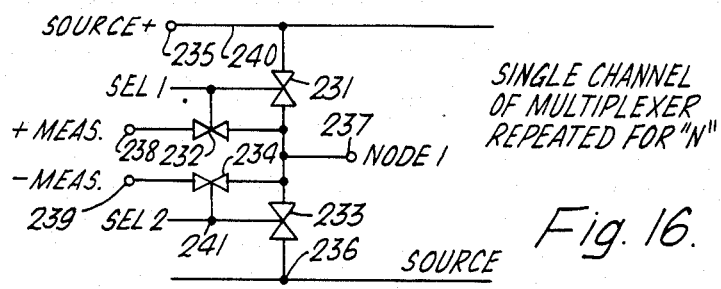
Fig. 16.
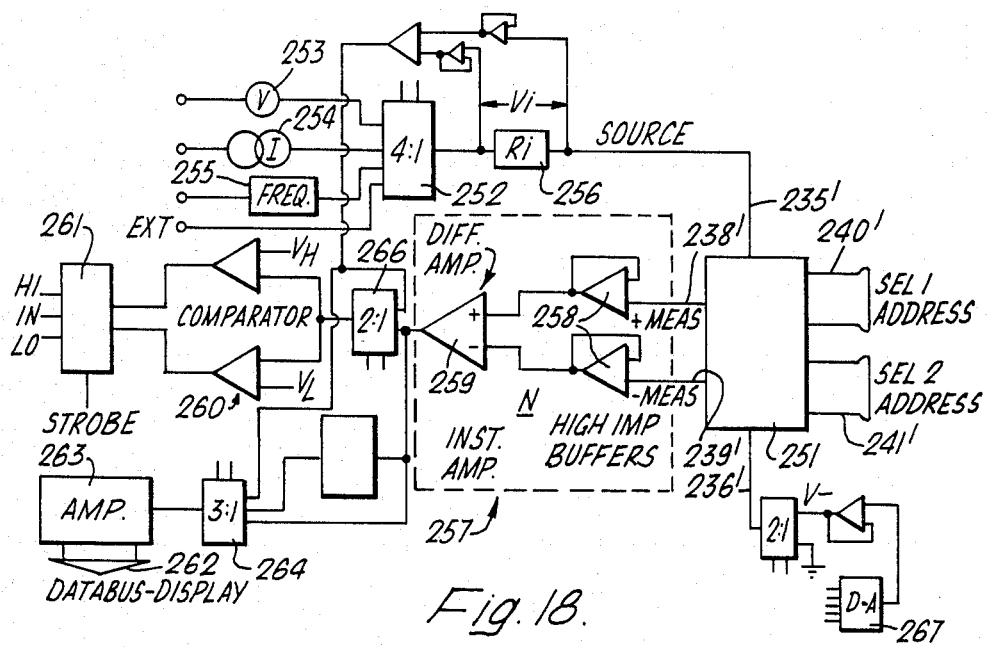
Fig. 18.
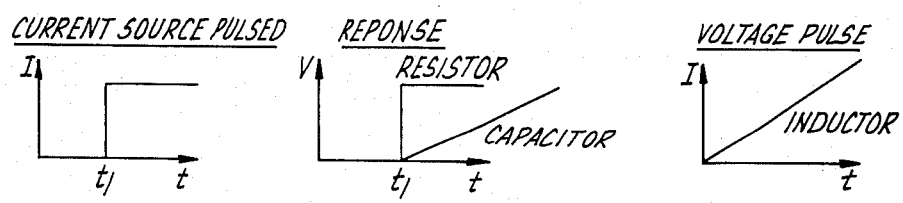

AUTOMATIC TEST EQUIPMENT

This is a continuation of co-pending application Ser. No. 674,559 filed on Nov. 26, 1984, now abandoned.

This invention relates generally to the field of automatic test equipment and instrumentation useful for the functional and diagnostic testing of electrical and electronics circuits.

Automatic test equipment is known which includes a programmable unit capable under the control of an operator of generating analog and/or digital stimuli and automatically applying such stimuli to a circuit under test and of probing nodes of the circuit to ascertain the circuit response and in consequence providing an indication as to whether or not the circuit is functioning properly and, if not, diagnosing wherein the fault or faults lie. Currently available automatic test equipment comprises relatively low cost machines which are relatively unsophisticated and provide relatively few user controllable facilities so that once set up to perform a certain test routine they cannot readily be changed to do something else, and also very expensive and highly sophisticated machines utilizing computer technology to provide a high degree of operational flexibility. However, insofar as we are aware, there is not currently available any automatic test equipment which provides operational flexibility and versatility at a reasonable and relatively low cost; the present invention aims to provide just such a machine.

The present invention according to one of its aspects resides in the concept of a modular approach in which optional interface modules selected to suit the particular requirements of a user are assembled into a programmable unit wherein software programmable hardware modules configured according to requirements provide a comprehensive range of test signal types and control features.

In an exemplary embodiment of the present invention which will be described more fully hereinafter a programmable controller, configured as a microcomputer and advantageously provided with full keyboard and high resolution colour or black and white graphics facilities, co-operates with a number of fixed interfaces, such as power supplies or facilities for the connection to the system of external specialist instrumentation or controls, and a user configured number of optional interfaces which might for example include multi-bit input/output modules wherein each bit may be individually user configurable as an input or as an output;

isolated logic modules providing multiple isolated logic inputs programmable to accept DC or AC as input states and opto-isolated from the remainder of the test system, and multiple isolated relay switch outputs under direct program control with the option of changing state on the occurrence of a SYNC;

relay matrix modules providing an X-Y relay switching matrix of X lines to Y lines for general purpose use with individually controllable relay switches at crossover nodes between the X and Y lines enabling any combination of connections to be set up and enabling the lines to be used for fan-in or fan-out applications;

probe interface modules providing electrical interfaces for probing arrangements wherein probes and active or passive jigs may be employed for stimulus and/or measurement at circuit nodes and via stimulus and measurement buses;

analog stimulus/response modules user controllable as to signal levels, frequencies, etc.;

analog function generator modules for generating user definable waveform shapes;

signature analysis and frequency measurement modules including phase measurement facilities;

sequence emulator modules for use in microprocessor or LSI emulation, pattern generation, logic state analysis and testing;

and other modules as will be described hereinafter or as the user may care to connect to the system. The system advantageously is arranged to interrogate the modules connected at any time into the system with the modules provided with unique code indications as to their type and function, whereby the system can determine for itself what modules are present and where they are located in the system structure and will organize its internal routines correspondingly.

The automatic test equipment according to the invention could advantageously be arranged to include a synchronisation bus comprising one or more signal lines designated to be used for the synchronisation of measurements and/or other events within the system with the synchronization being derived from the system computer, from any digital input line, via a probe, etc. The equipment could further include stimulus and measurement buses arranged, respectively, to allow any signal stimulus line to be switched onto a common stimulus line and to allow any signal to be measured to be switched onto a common measurement line to which all types of measurement facility provided in or associated with the equipment have access. By provision of such system buses, the resources of the system can be advantageously utilized to maximum advantage and a comprehensive self-test facility of the system can be implemented.

The system could further comprise special signal injector and/or measurement probes which in conjunction with the remainder of the system may be used to measure voltages (both AC and DC), current, frequency, digital levels and digital signatures, and which might also include an alphanumeric or graphic display for indicating to an operator information such as a designation of the next point to be probed in a sequence controlled by the system software. The probe advantageously might also incorporate a high speed analog to digital converter enabling the probe to act as a digital storage oscilloscope with waveform display on the graphics element of the overall system. Irrespective of the probe configuration, the system advantageously will be arranged such that an operator is instructed to probe designated circuit nodes in a sequence controlled by the software and the measured values or probed signals are displayed and/or vocalized and/or stored. An X-Y pin jig arrangement enabling a probe to be moved automatically for testing a series of circuit nodes under software control also might be provided, and additionally or alternatively a robot arm probing facility might be provided with a robot arm holding a probe to be moved automatically under computer control in an optimally programmed sequence to speed fully automatic diagnosis. The probe could further be arranged for use in a self test and diagnosis mode of the automatic test equipment for injecting signals into or receiving signals from any point within the automatic testing equipment itself and up to and including external connections.

Software for the system described might employ a standard operating system such as CP/M permitting access to a wide range of alternate support software and employing its own test program execution and editing facilities. The software desirably will be configured as an interfacing aid comprising a sequence of instructions on a question and answer basis and advantageously with colour prompting for special function keys with the key functions determined and controlled by the software, and will be designed to lead a user simply through the stages required to create an interface with a unit under test and to adapt the system for alternative signal levels, and will also initialize data for the test sequence adapting itself to the optional module configuration plugged in. The user has merely to define each signal by type and the software will then assign appropriate interface lines and create an interface wire list. Where specific data sequences or waveform shapes are required to be part of a test program, they can as described hereinafter be "drawn" with the aid of a light pen and graphics facilities and the software will encode them for the test program. The software may further accommodate self-learn algorithms for baseboard/loom testing and signature analysis, logic analyser display of signal lines, versatile input/output handler configurable for IEEE 488 instruments, and data logging facilities to a printer, serial channel or disc.

Also described herein is a manufacturing defects analyser (MDA) module which can be associated with the automatic test equipment. Whereas the automatic test equipment per se is designed to effect functional testing of a circuit board or the like under test, that is to say the testing of the circuit board by application to inputs of the powered-up printed circuit board of test signals and sequences thereof formulated to enable the functional operation of the assembly to be monitored by monitoring of corresponding signals obtained from outputs and other test nodes of the assembly, the MDA module is adpated not so much for functional testing of the overall circuit board assembly as for the determination of manufacturing defects such as short circuits, tracking faults, misinserted and/or missing and/or out of tolerance components, and the function of individual integrated circuits, etc. The MDA module satisfies the need for a relatively inexpensive testing apparatus of relatively limited application designed to enable the majority of the above fault categories to be identified prior to the full functional testing of assembled printed circuit boards. It has been found, primarily as a result of analysis of fault types, that by far the majority of functional faults originate at manufacturing defects such as those aforementioned, and that an acceptance rate in excess of 90% can be obtained on full functional testing if a preliminary rudimentary fault location is effected based upon location of manufacturing defects.

According to another aspect of the present invention therefore a manufacturing defects analyser module for testing the viability of components on a printed circuit board or the like comprises a matrix array of bidirectionally current conducting analog switching networks each defining a test point for connection to a node of a board under test and connectable by control of the switching network either to a stimulus source or to a reference (e.g. ground) potential and simultaneously to a corresponding input of a measurement facility.

The manufacturing defects analyser according to this aspect of the present invention is further characterised in that it advantageously comprises means enabling a plurality of stimulus sources to be selectively connected to the array of switching networks, thereby enabling both AC and DC current and voltage sources to be utilised to determine circuit board and component conditions.

The analog switching networks each preferably comprise four bidirectional analog transmission gates which could be configured as discrete field effect transistor circuits but preferably are in integrated circuit form. The four bidirectional analog transmission gates are commonly connected at one side to define the test point of the respective switching network and at their other sides define four terminals which constitute the input/output terminals of the network. Furthermore, the control terminals of the four analog transmission gates are preferably connected together to define two control terminals for the network so that by application of an appropriate input to a respective one of the two network control terminals a respective two of the bidirectional analog transmission gates will be switched into conduction so as to connect the test point of the network firstly to the stimulus source and secondly to a respective input of the measurement facility. If the other of the network control terminals is addressed with an appropriate input, then conversely the test point of the network will be connected to ground or any·other appropriate point in the measurement system and to a different input of the measurement facility.

The switching networks constructed of four bidirectional analog transmission gates thus will be appreciated to comprise four terminals each selectively connectable to a respective one of a stimulus source, a reference potential and two measurement nodes, a test point selectively connectable either to the stimulus source and a first of the measurement nodes or to the reference source and a second of the measurement nodes, and two network control terminals which determine which of the two different test point connections available through the network are realised.

In accordance with another aspect of the invention, the graphics facility advantageously will include a light pen enabling a user to "draw in" specific signal sequences or waveforms to be interpreted and encoded by means of system software for inclusion as required into a test program. According to this aspect of the invention therefore the invention provides a method of entering data representative of specific signal sequences and/or waveforms into a computerised testing monitoring and/or measuring facility to be incorporated into the operation of the facility, the method including the use of a means responsive to the manual representation by a user of the required signal sequences and/or waveforms for generating corresponding data inputs to the computer or microprocessor. More particularly this aspect of the invention provides a method of setting up a test program for an electrical system, instrument, circuit or component which includes the use of a light pen in conjunction with the graphics facility of a computer to enable a user to describe specific signal sequences and/or waveforms to the computer for inclusion in the test program.

A speech synthesis module advantageously may be provided for verbal communication between the system and its user, and the system advantageously will further comprise disc drives and a controller therefor, a printer port, and other such facilities commonly associated with microcomputer equipment.

The keyboard advantageously comprises a dual mode structure comprising a first QWERTY typewriter style electromechanical keyboard comprising full travel type keys and matrix drive and sense electronics for capacitive or other sensing of depressed keys and with a plurality of special function keys and, on the reverse of the electromechanical keyboard, a second membrane keyboard sharing with the electromechanical keyboard a common encoder circuit which communicates with the system microcomputer via a bidirectional serial dataline. As a preferred feature of the invention, the keyboards each have a row of differently coloured special function keys having software determinable functions and the colour graphics display of the system is arranged to display a row of correspondingly coloured key indicia segments each relating to a displayed menu or program selection option. By virtue of this arrangement the special function keys are of greatly enhanced benefit to the user and the use of the system, even in the performance of complex routines, can be made relatively simple and "user friendly".

Whilst the invention will be described hereinafter with particular reference to automatic test equipment, that is to say equipment adapted for the testing of electrical and electronic circuits separate and distinct from the automatic test equipment itself, it is nonetheless to be appreciated that test equipment according to the present invention can be configured for stand alone use as personalized instrumentation or as a personalized workstation in the sense that the instrumentation or workstation is configured by the user to suit his personal requirements. The present invention thus extends also to such a personalized instrumentation or workstation configuration comprising a controller as aforementioned in co-operation with fixed and/or optional interfaces selected in accordance with the task in hand. The invention thus is not limited as regards its usefulness to the field of testing.

The invention also extends to novel and inventive modules themselves as will hereinafter be described.

Further features and advantages of the present invention will become apparent from consideration of the following description of an exemplary embodiment of the invention which is illustrated in the accompanying drawings wherein:

FIG. 1A is a block diagram of the controller section of an automatic test equipment according to the present invention;

FIGS. 5A, 5B and 5C illustrate in block diagram form alternative techniques which may be employed in the automatic test equipment for signal identification by use of signature analysis and transition counting;

Figure 1B:
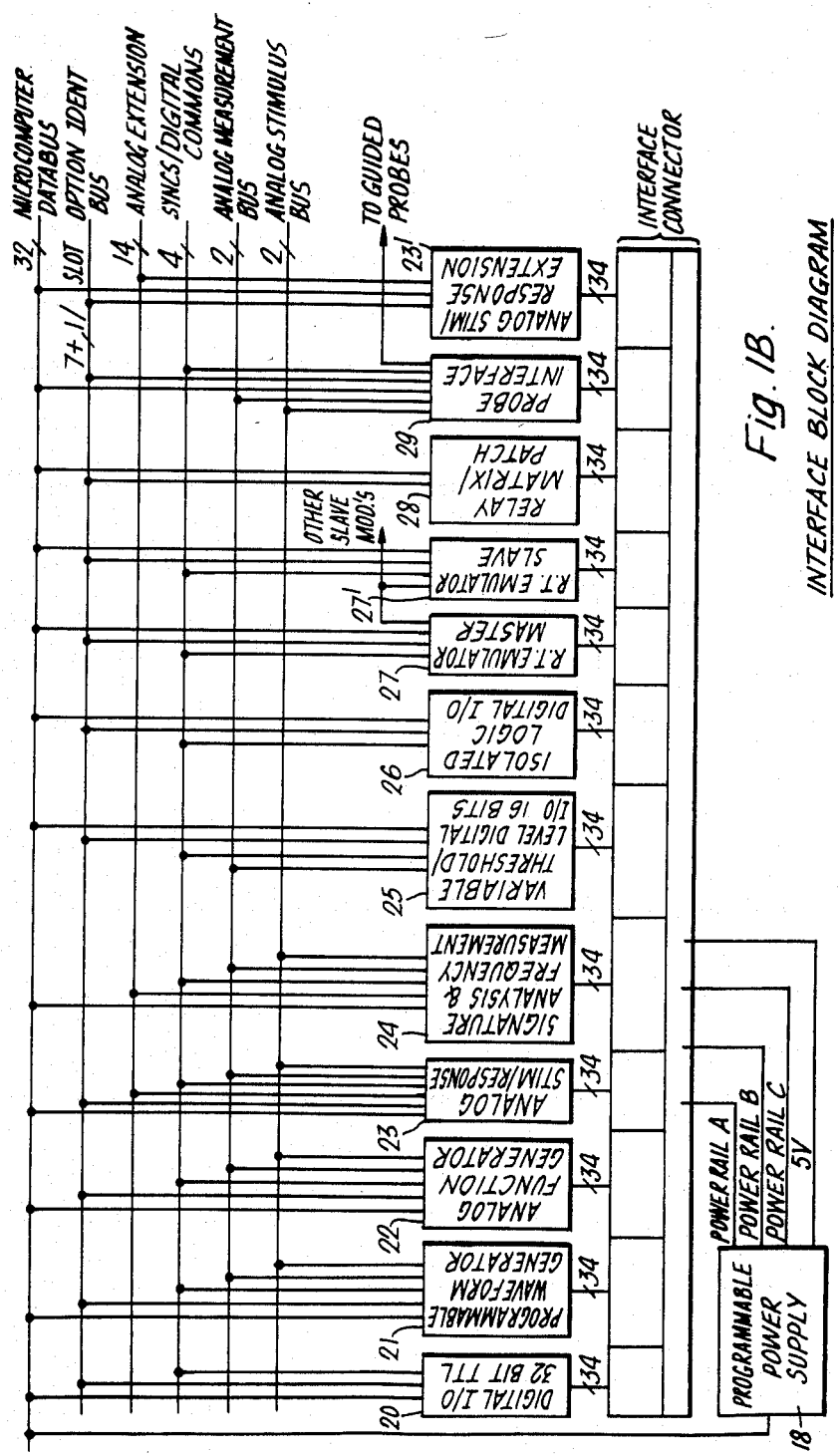
FIG. 1B is a block diagram illustrating the interface organization and data bus structure of the automatic test equipment of FIG. 1A.
Figure 6:
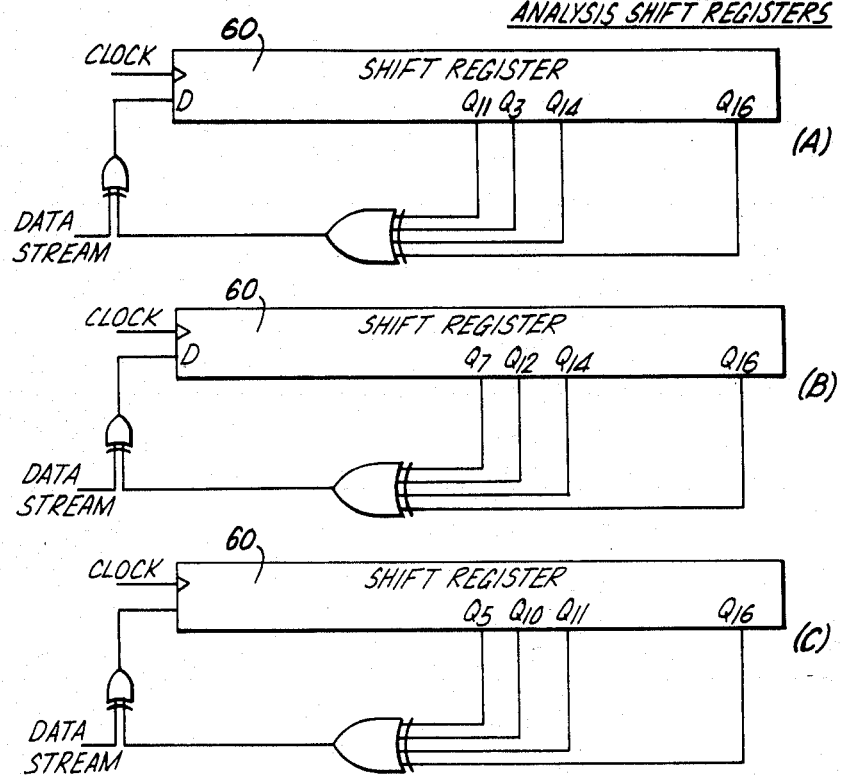
Figure 7:
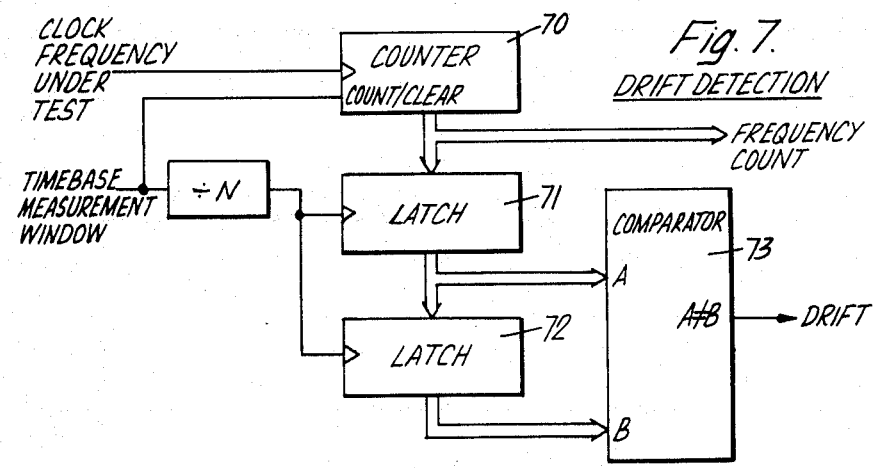
Figure 11:
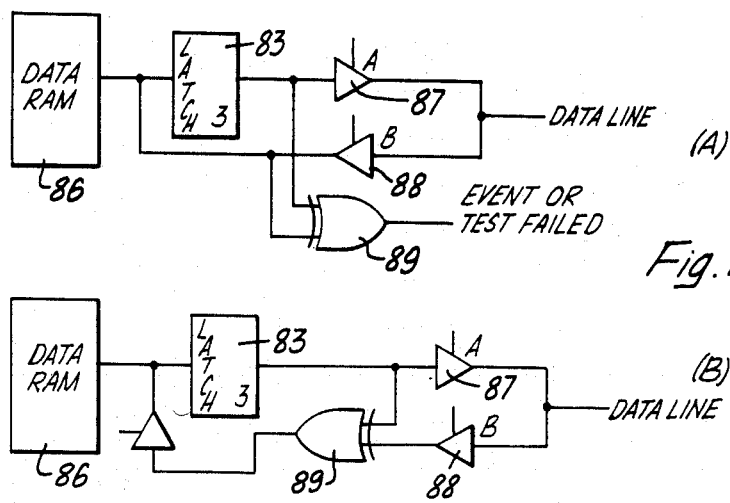
Figure 13:
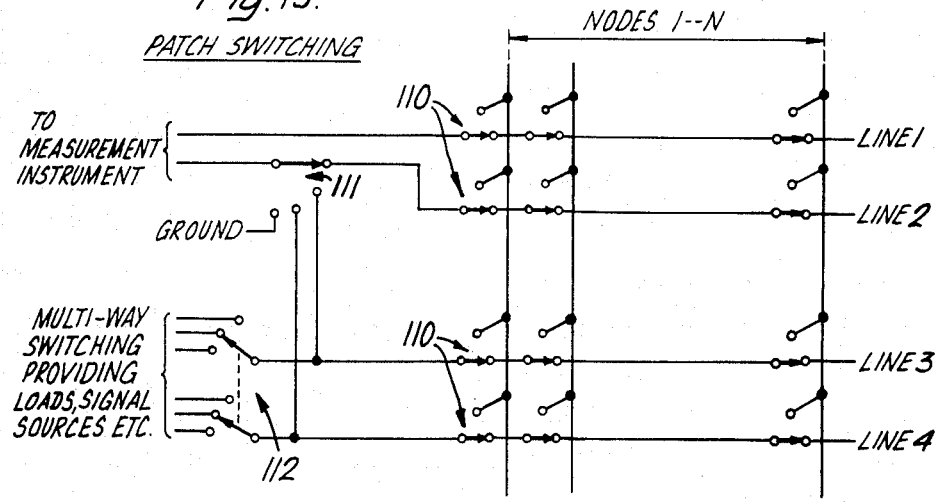
Figure 12A:
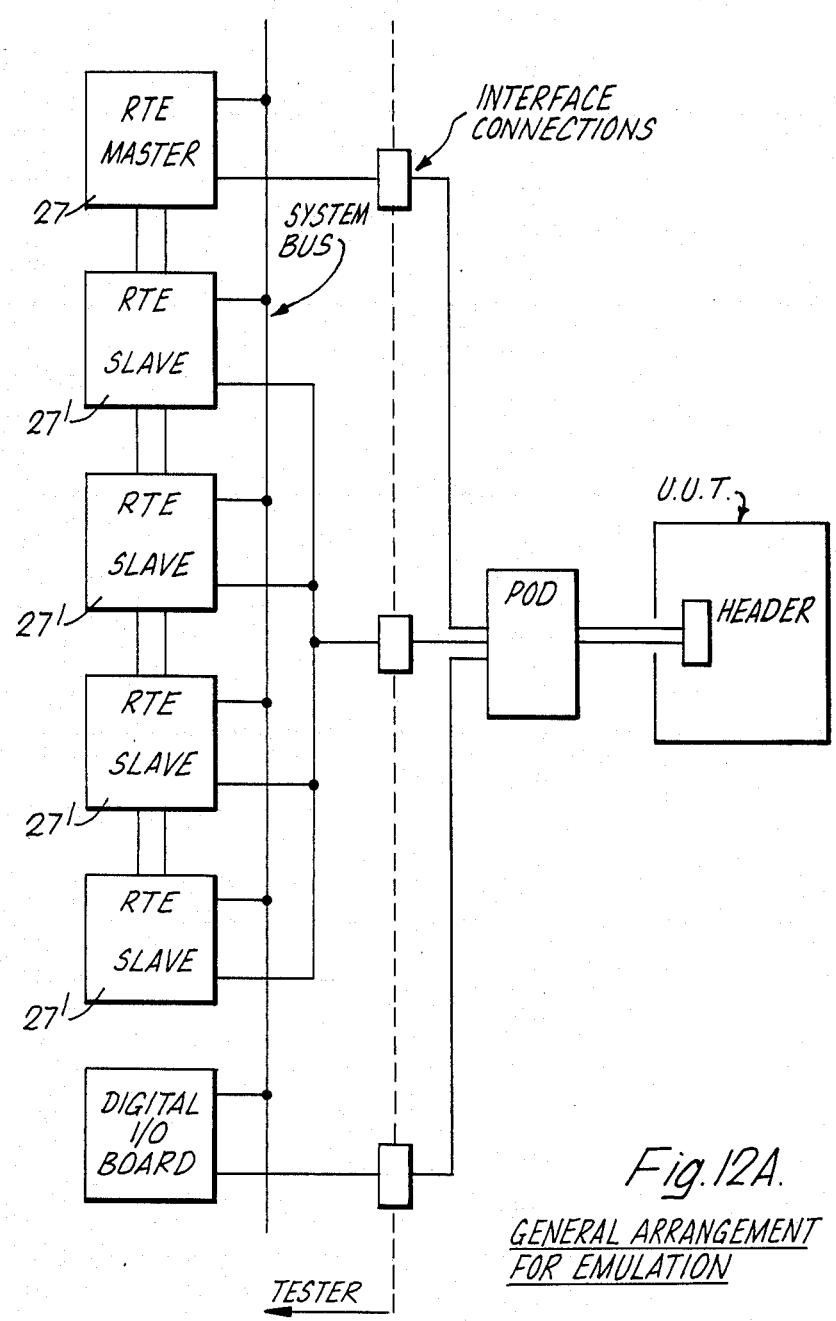
Figure 12B:
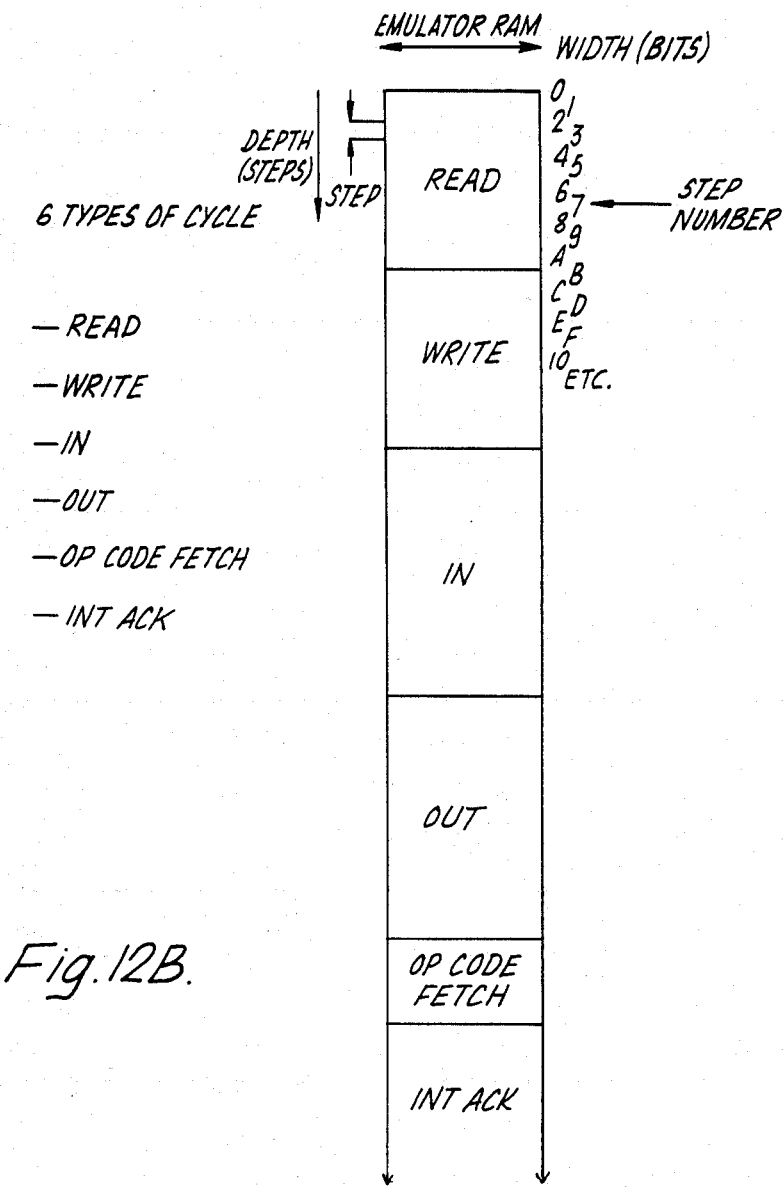
Figure 12C:
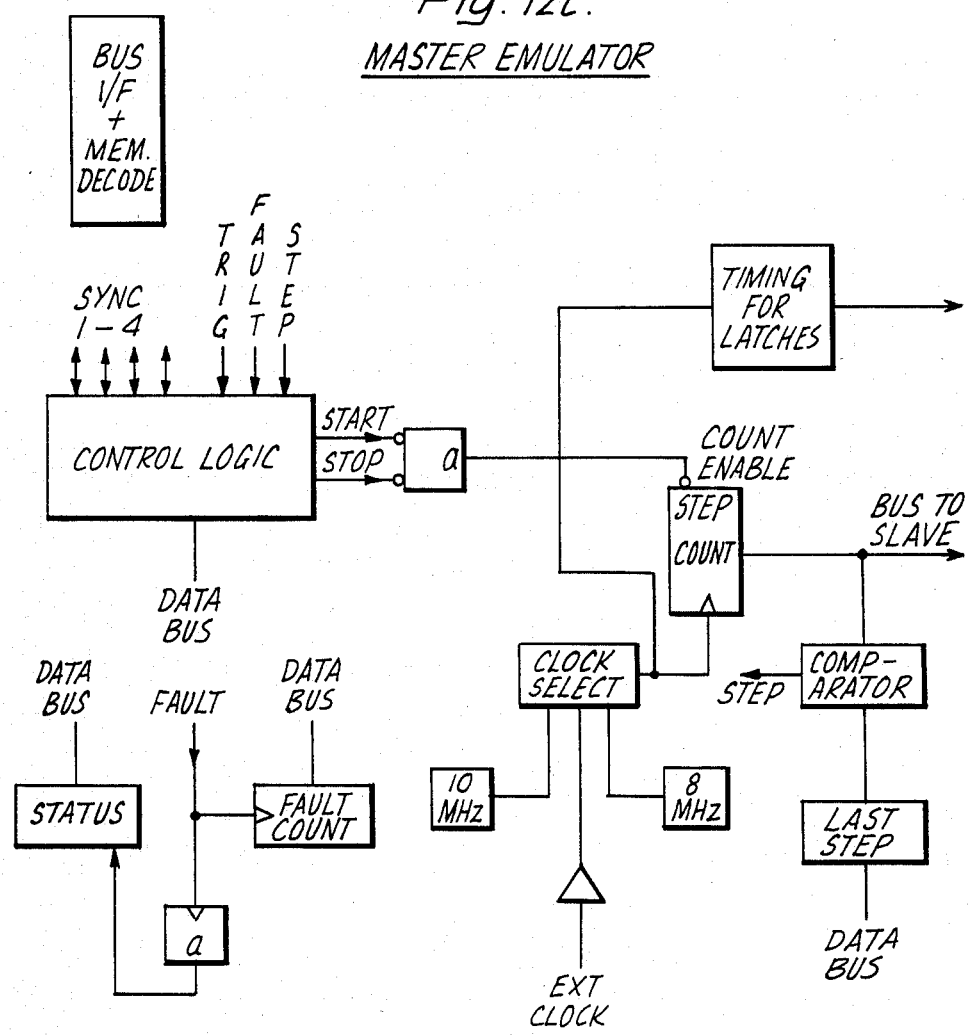
Figure 12D:
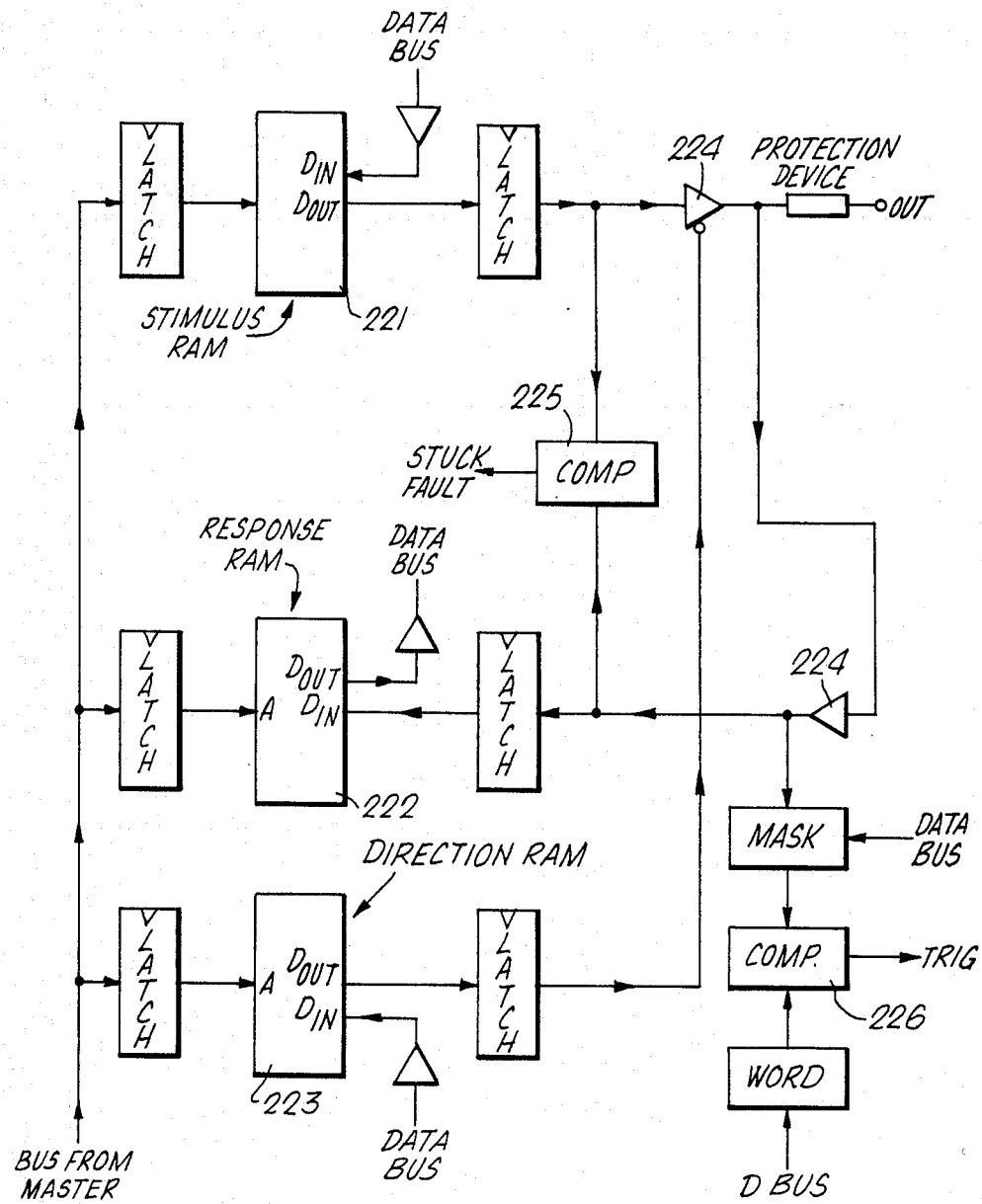
Figure 14:
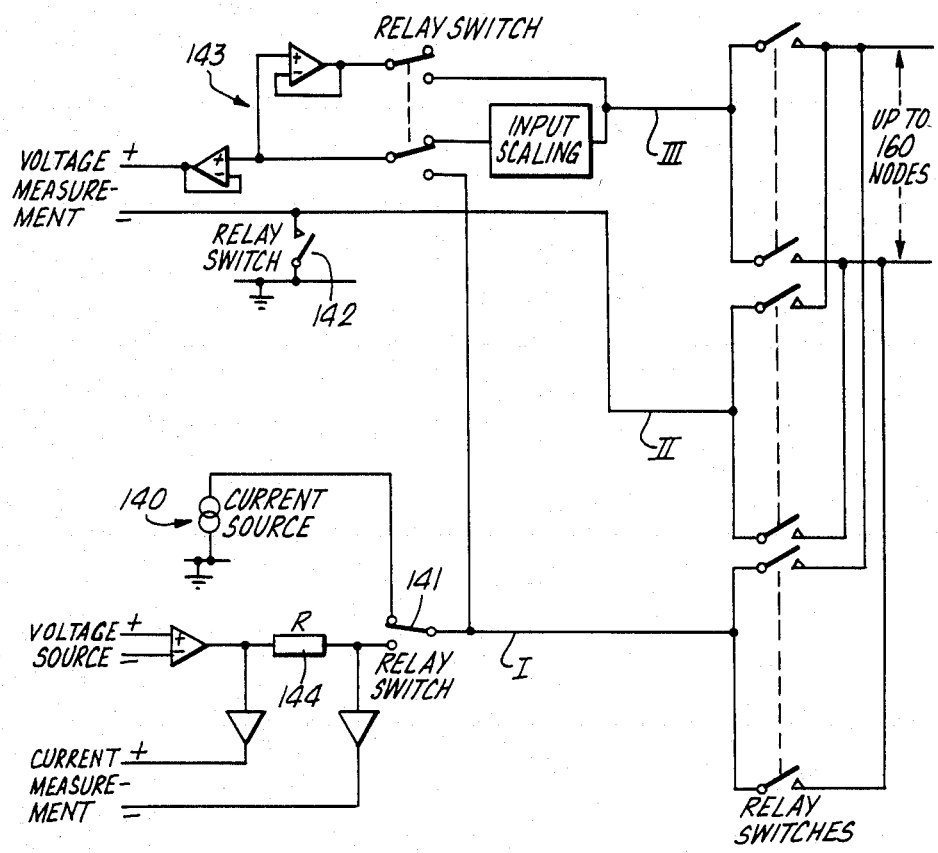
Figure 15A:
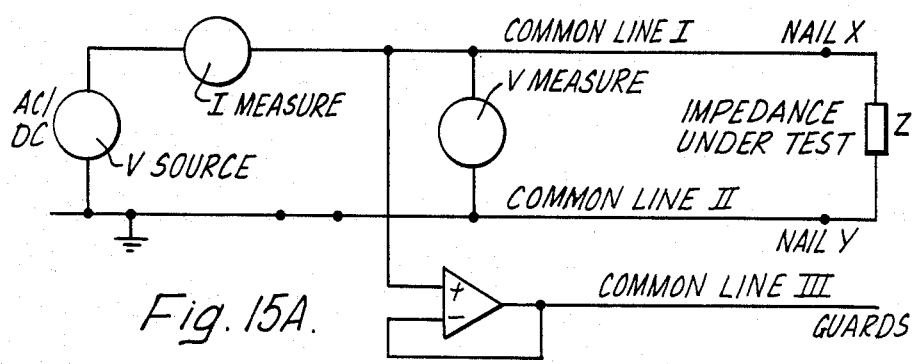
Figure 15B:
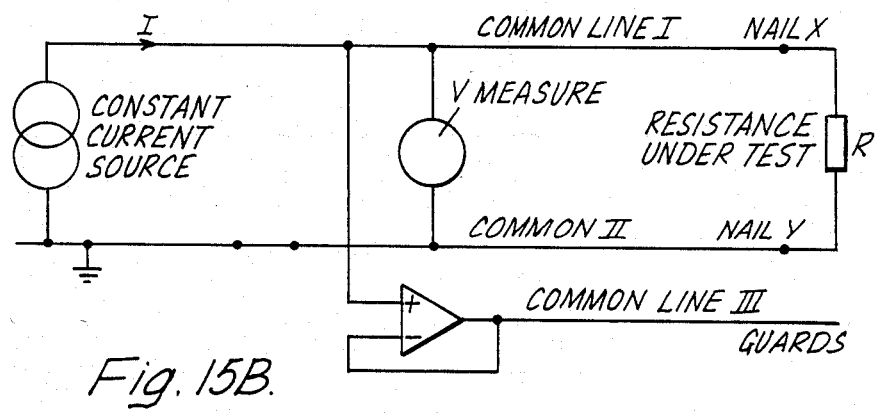
Figure 17:
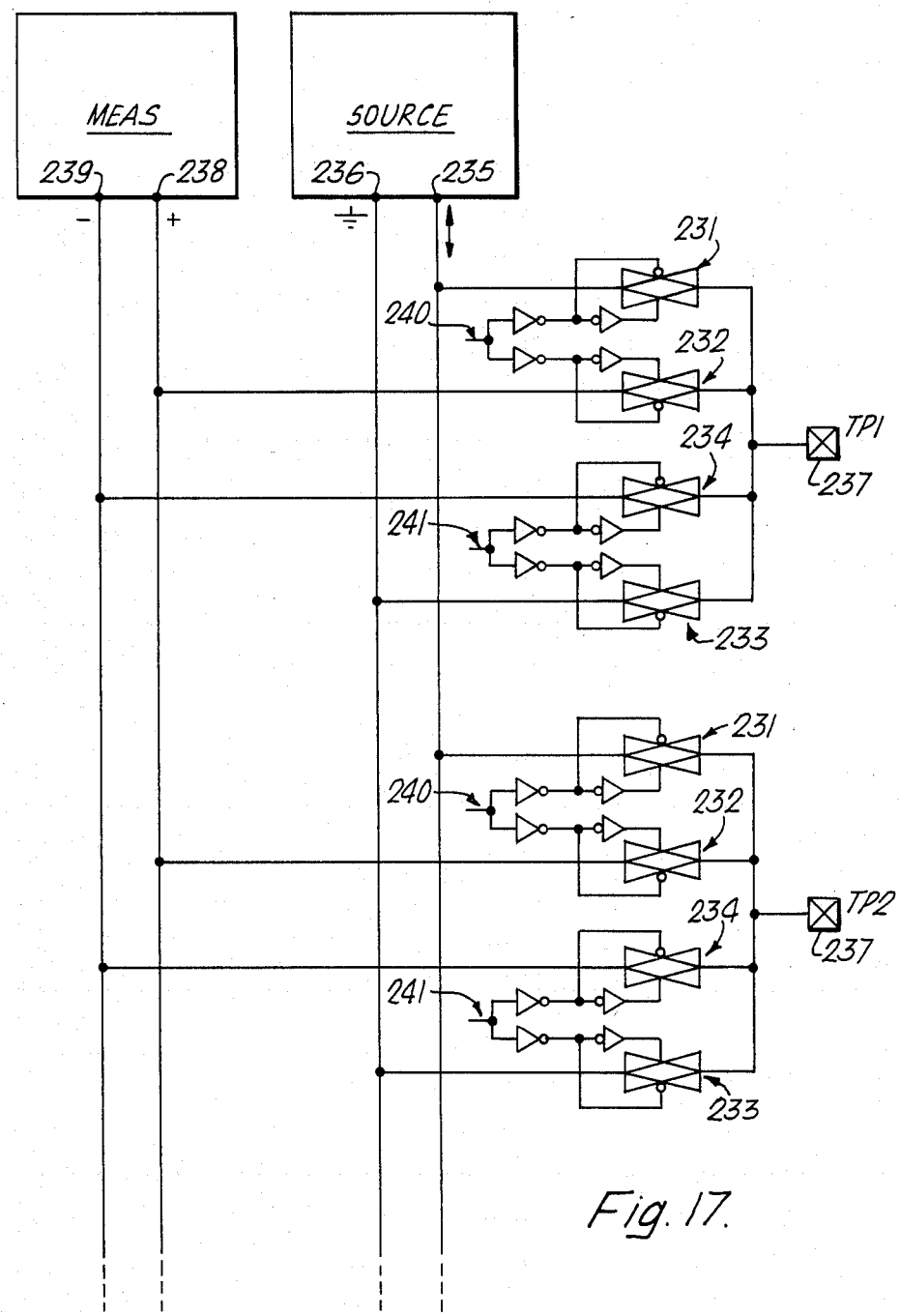
Figure 19:
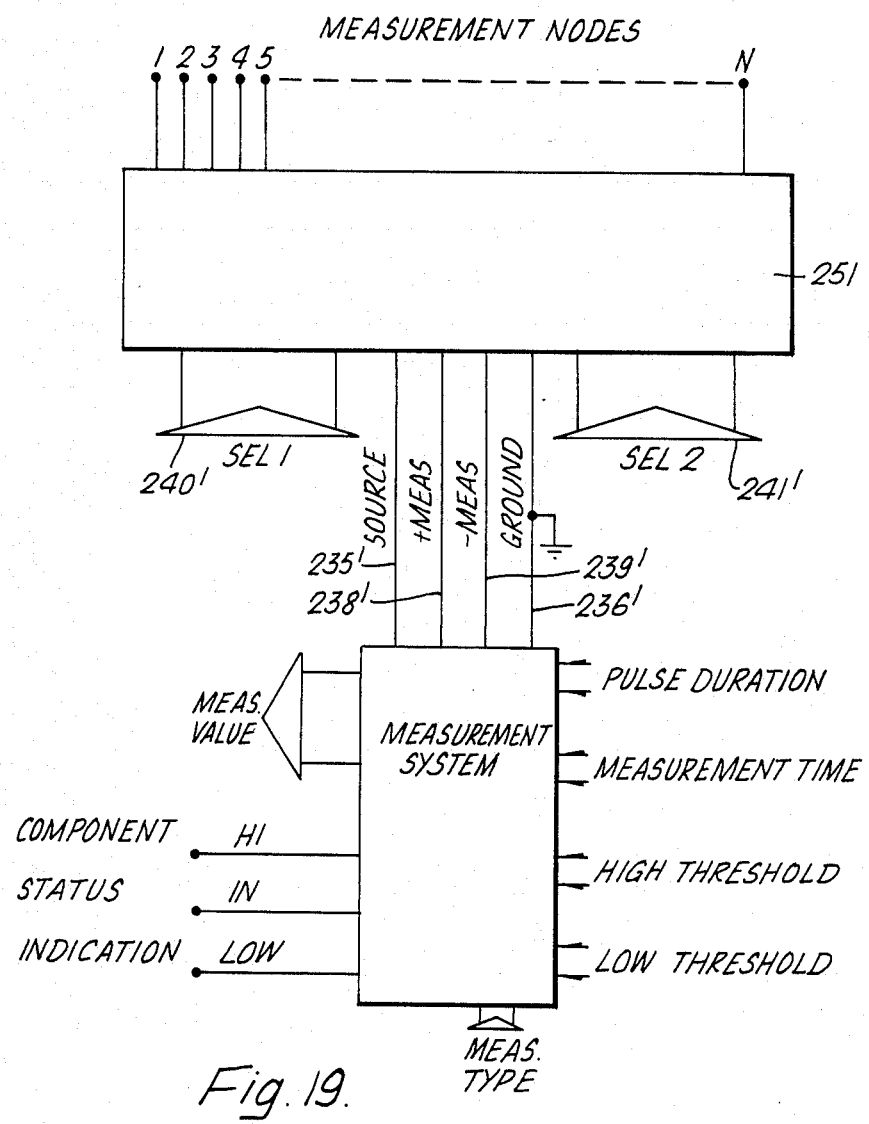

FIGS. 6A, 6B and 6C illustrated preferred signature analysis shift register arrangements usable with the arrangements of FIGS. 5A, 5B and 5C;

FIG. 7 is a block diagram of an exemplary frequency counting/timing module which can be incorporated into the automatic test equipment;

FIG. 8 is a schematic circuit diagram representing an exemplary practical realization of a signature analysis and frequency measurement module;

FIG. 9 is a schematic block diagram of an exemplary sequence emulator module which can be incorporated into the automatic test equipment;

FIG. 10 is a schematic representation of the cycle time of the sequence emulator module of FIG. 9;

FIGS. 11A and 11B illustrate modifications which can be made to the sequence emulator module of FIG. 9;

FIGS. 12A to 12D show an alternative emulator subsystem comprising a master emulator and a number of slave emulators each comprising a module of the system, FIG. 12A being a general arrangement diagram for the emulator subsystem, FIG. 12B illustrating the structuring of data in RAM's provided in the emulator subsystem, FIG. 12C illustrating the master emulator of the subsystem and FIG. 12D the slave;

FIG. 13 is a schematic representation of a patch switching relay matrix module;

FIG. 14 is a schematic showing of an active jig arrangement which can be used with the automatic test equipment;

FIGS. 15A and 15B are equivalent circuits which illustrate some of the operating principles of the active jig of FIG. 14;

FIG. 16 is a schematic representation of a switching network of a manufacturing defects analyser module which can be used with the automatic test equipment of FIGS. 1A and 1B;

FIG. 17 is a more detailed representation of the switching network of FIG. 16;

FIG. 18 is a schematic circuit diagram of an exemplary manufacturing defects analyser module; and FIG. 19 represents how the manufacturing defects analyser module interfaces with the automatic test equipment system.

Referring initially to FIGS. 1A and 1B of the accompanying drawings, these show in block diagram form the general arrangement and organisation of an exemplary embodiment of automatic test equipment according to the present invention. The embodiment adopts a modular approach in that the equipment is structured to enable variation of its configuration by selection between a range of functional modules, and by this means the equipment is capable of providing a comprehensive range of test signal types and control features the like of which has previously been available only in equipment costing orders of magnitude more than the hereinafter described embodiment. The concept underlying the embodiment is one of total interface modularity with individual interface requirements to suit any desired function being satisfied by selection from a standard range of interface modules and/or by the addition of special module types. In either case, the emphasis in the embodiment is upon use of software programmable hardware modules and ease of interfacing with standard software enabling engineers and the like who are new to the equipment swiftly to reach a condition of competence in interfacing and test program generation.

The hereinafter described automatic test equipment is structured into controller and interface sections as illustrated respectively in the block diagrams of FIGS. 1A and 1B and these will hereinafter be described in general terms before more detailed descriptions are provided pertaining to specific interface modules and other functional components. The controller comprises a microcomputer within the functional testing system which provides a central computing resource to control and sequence the operation of the hardware interfaces to the unit under test (UUT), and also includes control and data interfaces to the user of the system via a colour graphics display and multi-function keyboard, and peripheral interfacing. The interface section provides a variety of input and output signal types for connection to a UUT by virtue of the provision of a plurality of interchangeable interface modules which couple with the controller by means of a motherboard/daughterboard arrangement and communicate with the microcomputer input/output bus.

The controller is shown in FIG. 1A and generally comprises a microcomputer based for example upon a Z80A microprocessor designated 1, up to 512K bytes of dynamic random access memory (RAM) designated 2 and up to 32K bytes of EPROM for example; Winchester and floppy disc drives designated 3, a parallel printer port designated 4 and RS 232 and/or 422 serial input-/output ports designated 5. The controller further comprises a full keyboard 6, a high resolution mixed text and colour graphics display 7 advantageously with a light pen facility 8, and may further include a speech synthesis module 9 for operator instructions and/or other verbalisations. Other controller components which will be mentioned but not described in any detail on account of their construction and functions being standard in a Z80A based microcomputer are a baud rate generator 10, direct memory access controller 11, boot EPROM 12 for initialization of the computer, and timer module 13. Parallel ports 14 and 15 communicate the main system bus with a plurality of discrete switch lines and with an option code or option identifier bus respectively, the said discrete switch lines and option bus being represented in FIG. 1B, and a buffer 16 couples the main system bus to the main backplane input/output bus which also is represented in FIG. 1B.

Shown also in FIG. 1A though more properly to be regarded as an interface component is an IEEE 488 compatible interface controller 17 for the connection to the equipment of external specialist instruments such as for example a spectrum analyser. Other "fixed" interface components of the system comprise a programmable power supply unit 18 shown in FIG. 1B and providing for example a fixed 5 volt 5 amp power supply, a floating programmable power supply of from 0 volts to 50 volts at 0.5 amp, and two floating programmable power supplies of from 0 to 25 volts at 1.0 amp. Also a plurality of relay switches or the like may be included for the control of external functions.

Referring now particularly to FIG. 1B, the showing therein is principally of the "optional" interface modules as opposed to the "fixed" interface modules just mentioned. These optional interfaces are configured, in accordance with the present invention, as plug-in modules which can be assembled in the automatic test equipment in whatever combination of however many of one or more different modules may be desired to suit the requirements of the user. Shown in FIG. 1B is the microcomputer input/output data bus, the interface module identifier bus (option ident bus), and the individual switch lines available from the components 16, 15 and 14 respectively of the controller described with reference to FIG. 1A, and although not illustrated it will be understood that a facility is provided for connection to the microcomputer input/output bus, to the module identifier bus and to however many of the discrete switch lines as may be appropriate for the module in question of one or more of a plurality of different plug-in modules, each of which can be plugged into any of a plurality of available module connection locations in a motherboard/plural daughterboard arrangement. The system is arranged to identify what type of module option is located in which connection location and to organize its internal routines accordingly. An interface connector 19 is schematically illustrated for enabling circuits or equipment under test to be appropriately connected to the plug-in modules.

Various exemplary plug-in module options are schematically represented in FIG. 1B and are designated with the reference numerals 20 to 29. Considered in turn from left to right as viewed in the figure the various modules briefly comprise:

(a) a TTL digital input/output module 20 providing 32 discrete digital lines with active levels characterised for transistor-transistor-logic (TTL) and similar logic arrangements including CMOS logic, and with each of the 32 discrete digital lines being individually configurable under software control as either an input or an output, and also dynamically changeable under software control. The discrete lines (whether configured as input or output) can be used for generation of SYNCs on transitions or on pattern matches and output states (and changes of input/output states) can optionally occur on a SYNC;

(b) a programmable waveform generator module 21 providing a plurality of programmable waveform generator channels wherein the waveform shape is defined in a digitised form of the normalised instantaneous waveform amplitude at a sequence of regular step intervals, such sequence of amplitude values being held in RAM (random access memory) and stepped through in sequence with the digital values each being converted to a corresponding analog value which may additionally be amplitude scaled and subjected to a DC offset under software control. Each channel may have separate RAM and control circuitry enabling each to be set to different step rates, amplitude scalings and offsets, and the outputs may advantageously be relay isolated with routing allowing any output to be routed onto the analog stimulus bus or the analog measurement bus shown in FIG. 1B. Furthermore, means may be included to enable any channel to be amplitude modulated from any other channel on the module or from the analog stimulus bus, and SYNCs may optionally be generated on any step from the waveform generator RAM and/or utilized to reset any channel step member to the beginning of the respective sequence;

(c) an analog function generator module 22 providing a plurality of output channels program selectable between sine, rectangular, triangular etc. waveforms for generating user-definable analog waveform shapes with selectable amplitude, frequency and DC offset, and with the analog outputs advantageously relay isolated and optionally modulated from 0 to 100% from either the analog stimulus bus or from another channel on the module itself and optionally routed onto the analog stimulus bus and/or onto the analog measurement bus, and with each channel preferably including a zero-crossing detector for generation of a SYNC in a one-shot mode upon a zero-crossing;

(d) an analog stimulus/response module 23 providing DC and AC voltage measurement capability and a plurality of low current DC voltage level outputs, wherein voltage measurements may be taken from any of a plurality of input lines or from the analog measurement and stimulus buses, voltage waveforms or DC levels can be routed onto the analog measurement and/or stimulus buses, and input voltages may be sampled in response to a SYNC input to the module. The analog stimulus/response module 23 may further optionally control up to a predetermined number of analog stimulus/response extension modules 23' and provide stimuli and make measurements through them, each extension module 23' providing a predetermined number of DC or AC measurement channels and voltage outputs, and can generate SYNCs on alarm type functions on any input or output when the respective input/output current/voltage is greater/less than a predetermined limit.

(e) a signature analysis and frequency measurement module 24 providing for the measurement of frequencies of up to, say, 50 MHz and the taking of compressed digital data signatures and comprising a plurality of variable level and TTL level compatible inputs with the facility further to take inputs from the analog stimulus and measurement buses or from the SYNC lines (the latter providing a direct means of taking digital input signatures) and advantageously also to provide phase difference measurements, pulse width and pulse counting facilities;

(f) a variable threshold/level digital input/output module 25 providing a plurality of discrete digital input/output lines each individually configurable and dynamically changeable under software control as an input or as an output, threshold levels for logic 0 or logic 1 inputs and/or outputs being user configurable for all of the lines under program control, SYNC generation being enabled on any logical transition from 0 to 1 or from 1 to 0 on any discrete input/output line or on a pattern match on the input/output lines in a one-shot or a retriggered mode, and input/output lines being selectively routable onto a SYNC line to enable a signature to be taken from the line using a signature analysis and frequency measurement module (as described above). Furthermore, input data from the input/output lines may advantageously be latched upon the occurrence of a selected SYNC, and updates to output lines (and the input or output state of input/output lines) can also be programmed to occur on a selected SYNC;

(g) an isolated logic digital input/output module 26 providing a plurality of opto-isolated logic inputs programmable to accept DC or AC input states, such inputs being readable directly under program control at any time or being latched in response to a SYNC, and a plurality of single-pole single-throw isolated relay switch outputs under direct program control with the option of SYNC intervention to initiate a change in state. Input lines may be directly routed onto a SYNC line to enable a signature to be taken from the line by means of a signature analysis and frequency measurement module (as described above), and SYNCs can be generated in response to any transition on any input line or pattern match on the input lines. Furthermore a rectified and digitised input may be routed onto the analog measurement bus to allow the frequency of an AC input voltage to be measured;

(h) an emulator subsystem comprising master emulator and slave emulator modules, 27 and 27' respectively, for providing high speed parallel digital input/output and giving a combination of data output and data capture useful for pattern generation, logic state analysis and microprocessor emulation. The master emulator module 27 comprises the control circuitry for up to a predetermined number of slave emulator modules and provides sequencing controls to the slave emulators which, for their part, comprise a plurality of high-speed RAM backed digital input/output lines each dynamically changeable between input and output states;

(i) a multiplexer switching module 28 providing a relay switching X-Y matrix for general purpose use having individually controllable relay switches located at each crossover node between the X and the Y lines and enabling any combination of connections to be established for example for use in fan-in or fan-out applications;

(j) a probe and probe interface module 29 provides the necessary electrical interfaces for one or more probes and/or jig arrangements enabling stimulus and/or measurement via routings to the analog stimulus and/or measurement buses respectively.

It is of course to be appreciated that the features and characteristics of the above-mentioned modules are susceptible of variation substantially at will, and that the modules as described are merely exemplary of modules which are presently considered to be useful.

Also illustrated in FIG. 1B is an advantageous bus structure designed to accommodate the variety of interface module types above-mentioned whilst sharing system resources in order to obtain optimum performance at reasonable overall cost. As shown, the bus structure comprises the microcomputer databus which serves for controlling the individual interface modules and for passing digital data to and from the respective interface modules, the option identification (option ident) bus enabling module types and their locations in the system backplane to be signalled to the microcomputer, analog stimulus and analog measurement buses which are central to the sharing of analog resources within the system, and a plurality of sync/digital common lines. The analog stimulus and measurement buses enable measurement resources, such as for voltage and frequency measurement, to access the analog measurement bus for measurement of AC or DC analog signals, and enable signal stimulus resources such as the analog function generator module or the programmable waveform generator module to provide output signals on designated test pins and/or probes; also the analog stimulus and measurement buses can be used for self test routines by routing predetermined stimuli onto a bus and checking such stimuli by means of a measurement resource.

The sync/digital common lines, there being no restriction on the total number of such lines that can as desired be provided, can advantageously be utilized for the synchronisation of events within the system without the direct intervention of the microcomputer. This enables a slower and more reasonably priced microcomputer to be employed in a mode wherein, rather than the computer having absolute control of every action and event, the computer is instead informed that an event has happened or is happening and proceeds correspondingly. To enable any module to generate SYNCs an open collector type of SYNC line can, for example, be used. SYNCs themselves can be used, for example, to capture voltages, data bits, etc. and to start or stop measurements etc. SYNCs can be generated from digital input transitions, data bit comparisons, attainment of analog signal thresholds etc.

Figure 2:
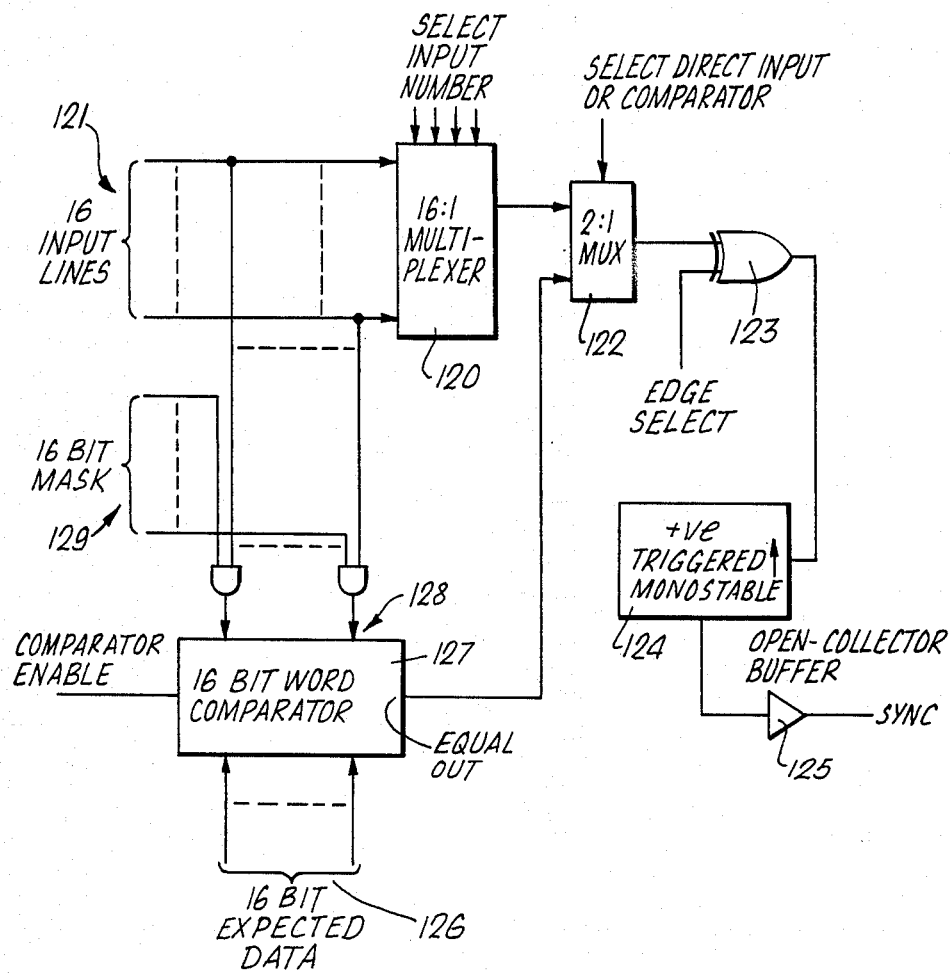
FIG. 2 is a schematic circuit diagram showing an exemplary arrangement for the generation of a SYNC signal.

FIG. 2 of the accompanying drawings illustrates an exemplary sync generation arrangement which may be utilized in the practice of the present invention. The arrangement shown is adapted for the generation of a pulse on a SYNC line in response to a transition occurring in any of up to sixteen input lines, or in response to a change in the output from a 16 bit word comparator arranged to compare the status of up to sixteen input lines with a predetermined data pattern. A 16:1 multiplexer 120 is software controllable to select any of its 16 input lines designated 121 and to apply signals on the selected line via a 2:1 multiplexer 122 to exclusive OR gate 123, and thence to monostable circuit 124 and open-collector buffer 125. An EDGE select input to gate 123 enables the sync generation to be selectable as between positive or negative edge of a signal transition, or as between the beginning or the end of a detected match between the inputs from the lines 121 and a predetermined or expected data pattern established at the inputs 126 of a 16 bit word comparator 127, the comparator 127 receiving at its other inputs 128 the signals from the sixteen input lines 121 masked as desired by gating with masking inputs 129.

SYNC lines may also be utilized within the system as digital common lines to allow digital measurement resources, for example for taking a digital signature, to be linked to a wide range of inputs in similar fashion to the analog measurement and stimulus buses. By addition, furthermore, of timing modules it is possible to trigger one SYNC a desired time period after another SYNC has occurred which enables complex time sequences to be established within the system without involvement of the microcomputer.

The automatic test equipment briefly described in the foregoing, and to be described in more detail hereinafter at least as regards its principal features, is useful for the functional and diagnostic testing of digital printed circuit boards and systems, mixed digital and analog printed circuits and systems, analog circuits and systems and microprocessor based circuits and systems. The equipment is further useful for in-circuit stimulus and measurement applications, and can be utilized for microprocessor emulation functions where it effectively replaces a microprocessor. The equipment is useful furthermore as a designer's prototyping tool for the evaluation of designs by virtue of the facility provided for simulating the design conditions and criteria by means of the equipment.

As will hereinafter be described in more detail, the automatic test equipment according to the invention can interface with a unit under test (UUT) in a number of different ways included amongst which are by means of versatile test probes and by use of bed-of-nails type testing jigs. These latter can be of conventional passive type, or alternatively and/or additionally can comprise a special active jig type, and permit rapid and reliable connection to be made between UUT connectors provided in the automatic test equipment and the UUT via wire wrap posts within interchangeable and generally vacuum operated jig fixtures. The passive jig type provides a straightforward means of connecting signals from the UUT connectors of the system to a printed circuit board or the like under test, and the active jig enables the rapid scanning of a number of test nodes through the use of relay switches as an alternative to the manual probing of nodes and thus is particularly useful in achieving rapid diagnostics. The system enables hand held test probes, guided by the system software via the graphics display, to be used for stimulus and measurement of voltages with routings from the probes to the analog stimulus and measurement buses being provided, and further advantageously enables two probes to be used in conjunction to perform impedance measurement by application of a voltage stimulus derived from the stimulus bus and measurement of the current response at the measurement bus.

In operation of the automatic test equipment, system software provides an interfacing aid to the user so as to lead him simply through the stages required for creating an interface and for adapting the system for the required signal levels. The software also initialises data for the required test program and adapts to the configuration of module options provided, with the user merely having to define each signal by type and the software assigning appropriate interface lines and creating an interface line list. Where specific sequences or waveforms are required to be created, they may be drawn in by the user with the aid of the graphics display and the light pen, the software being arranged to interpret and encode the drawn material into the test program. The hardware of the system may be complemented by a programming language which provides two levels of program, namely a high level to provide overall test control flow and a mid level to provide control of the system's stimulus and measurement hardware. The modularity of the hardware may be supported by a programming language translator built in two parts, namely one part which performs the actual operations to convert symbols in the source program to code values and a second part which defines the relationship between source program symbols and code values. This second part can be modified by the end-user, or the system's manufacturer, to accommodate any new program instructions which may be required in order to support new stimulus or measurement facilities added to the system by the fitting of a new module type.

Figure 3:
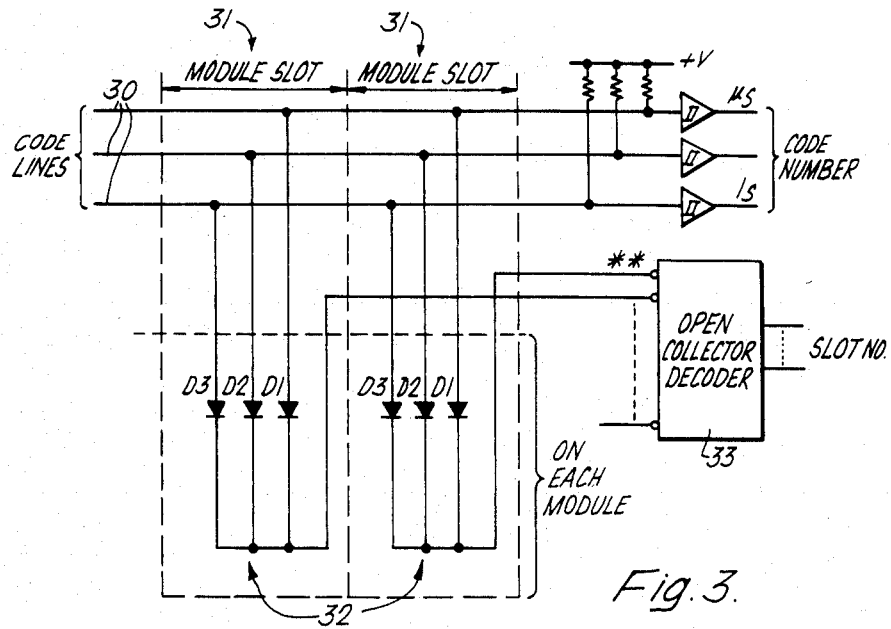
FIG. 3 is a circuit diagram illustrating a means of identifying the interface modules provided at any time in the automatic test equipment and indicating furthermore their location within a system backplane.

FIG. 3 illustrates an exemplary means of identifying the nature of the modules incorporated at any time into the equipment and the locations of the respective modules in the system backplane. Multiplexed n-bit code lines are used in conjunction with open collector enable lines to each of a plurality of module plug-in slots provided in the system backplane. The number of code lines required will depend on the number of module options to be catered for, with n-bits catering for $(2^n-1)$ module options. In FIG. 3, the arrangement for accommodating up to seven options is illustrated, but this is readily expanded for any number of options by increase of the number of code lines and correspondingly of the number of diode connections available per module. The code lines are designated 30 in FIG. 3 and a pair of module slots 31 are shown accessible by any of a plurality of module types 32 each of which is provided with a unique selection of one, two or three diodes D1, D2, D3 the cathodes of which are connected individually for each module to a respective open collector line of an open collector decoder unit 33. In operation of the FIG. 3 circuit, the module slots are interrogated by virtue of the open collector lines of the unit 33 being driven sequentially to connect the cathodes of the one or more diodes of a respective module plugged into a respective slot to ground. This causes forward biassing of the respective diodes with the result that corresponding ones of the code lines 30 are set to a voltage of ground plus diode forward voltage drop rather than +V. The system is arranged to interpret such voltage changes on the code line 30 as logic levels which provide code number identification on the code lines 30 corresponding to the nature of a module plugged into a respective module slot; at the same time the open collector decoder unit 33 provides slot number identification of the backplane slot corresponding to the respective module. By this means selected optional modules can be plugged into the system backplane in any configuration and the system can determine what modules are assembled and where they are located and adapt its operation correspondingly. Where interrogation of a slot location reveals that all codes lines are at a voltage +V corresponding to no diodes D1, D2 or D3 being provided, the system is arranged to deduce that the respective slot is empty and has no module plugged into it.

Figure 4:
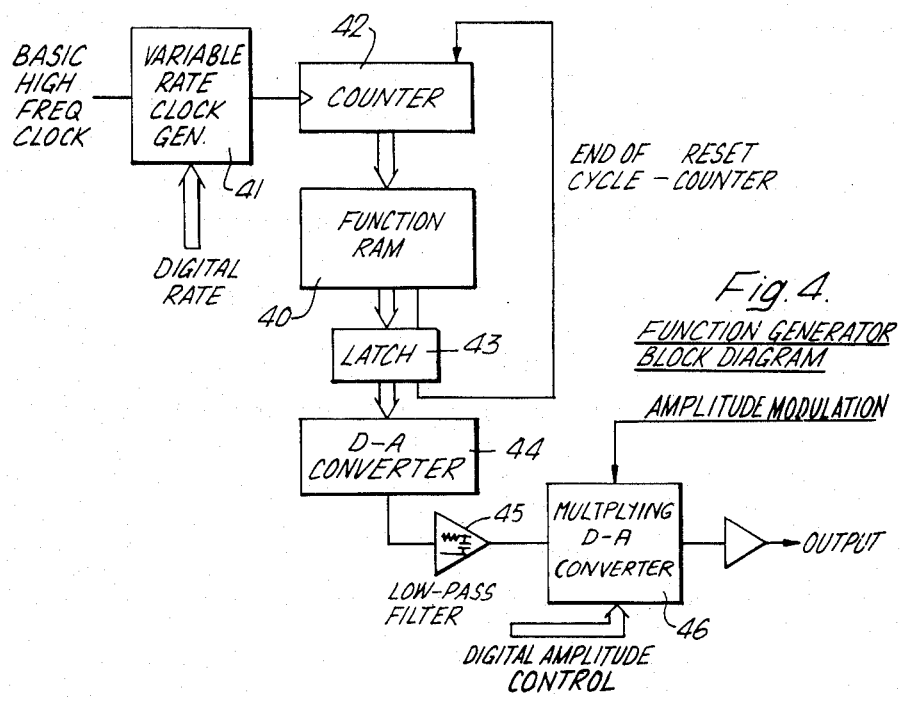
FIG. 4 is a block diagram of an exemplary function generator module one or more of which can be incorporated as desired into the automatic test equipment.

FIG. 4 illustrates an exemplary digitally controllable programmable waveform generator which can constitute the waveform generator 21 of FIG. 1B and which is capable of generating both simple and complex waveforms at variable frequency and amplitude. As shown, the programmable waveform generator is constructed around a digital function RAM (random access memory) 40, the data contents whereof can be loaded by the user by use of appropriate data entry means which can be conventional and which have been omitted from the figure for the sake of clarity. A variable rate clock generator 41 driven from a basic high frequency clock signal is controlled in dependence upon a digital rate input and the variable clock output is applied to a counter 42 coupled to control the address sequence of the function RAM 40. The data output bus of the function RAM 40 is coupled via latch circuit 43 to digital-to-analog converter 44, and the output of the latter is coupled via a low-pass filter circuit 45 to a multiplying digital-to-analog converter 46 the scale factor whereof is determined by a digital amplitude-control signal.

In operation of the thus described waveform generator, the desired waveform shape is set up in the function RAM 40 taking account of the full resolution of digital-to-analog converter 44 in order accurately to describe the waveform for a fixed level output in as many steps as may be necessary. The counter clock is then set via the digital rate value input in order to give the desired period/frequency using the number of steps loaded in RAM 40 to describe the waveform. To achieve a given output peak-to-peak voltage, the digital value fed to the multiplying digital-to-analog converter 46 is set to scale up or down as required from the fixed level aforementioned adding in a fixed DC offset as necessary. The waveform generator as thus described is capable of attaining a high degree of accuracy as regards the periodicity and frequency of the derived waveforms on account of its operational basis in digitally derived steps using a variable rate clock divided by rate multipliers, and as regards the resolution and amplitude control of its output.

The above-described waveform generator could further comprise:

(i) a selectable ROM (read only memory) in parallel with the function RAM 40 and containing standard waveform shapes, for example sine waves, triangular waveforms etc.;

(ii) either another counter multiplexed in, or a parallel waveform generator, for generating accurate phase relationships between signals by virtue of being able to preset the counters;

(iii) an extended width function RAM 40 to hold control data allowing a given level to be held for a number of counter clock cycles enabling fine detail from a limited RAM depth;

(iv) a facility whereby the output of one or more waveform generators as described may be modulated by the output of another such waveform generator, or from the analog stimulus bus, so as to achieve modulation cross-coupling between several waveform generators or between the waveform generators and the respective buses.

In one exemplary programmable waveform generator module according to the invention, two programmable waveform generator channels are provided with the required waveform shapes defined under software control in a digitised form of the normalized instantaneous waveform amplitude at a sequence of regular step intervals. The sequence of amplitude values is held in RAM and stepped through in sequence, with the values being converted into analog values which may then be amplitude scaled and/or subjected to DC offset in each case under program control. Each channel of the module has separate RAM and control circuitry enabling each to be set to different step rates, amplitude scalings and DC offsets. The outputs are relay isolated with routing permitting either channel output to be routed onto either the analog stimulus bus or the analog measurement bus, and furthermore each channel may be amplitude modulated from the other channel on the module or from the analog stimulus bus. The module further provides a facility whereby either channel may be reset on a selected SYNC, and either output channel may be routed onto the analog stimulus bus or onto the analog measurement bus.

The TTL digital input/output module 20 and the analog stimulus/response module 23 have been briefly described in the foregoing and may take any convenient form. For example, the analog stimulus/response module 23 which has the principal function of setting up DC and AC voltage levels for testing circuits may comprise an appropriate array of analog-to-digital and digital-to-analog converters. It is considered that no detailed description of these modules is necessary for a full understanding of the invention. However, in an exemplary practical embodiment of the TTL digital input/output module, 32 discrete digital lines with active levels characterised for TTL logic and similar logic arrangements (including CMOS logic) were provided. Each of the 32 digital lines was individually configurable under software control either as an input or as an output, and could also be dynamically changed under program control. The discrete lines, whether configured as inputs or as outputs, could be used to generate SYNCs on transitions or on pattern matches, and output states and changes of input/output states could be arranged to occur on a SYNC. The input/output lines furthermore could be routed onto a SYNC line directly to enable a signature to be taken from the respective line by means of a signature analysis and frequency measurement module installed in the system. Likewise, in an exemplary practical embodiment of the analog stimulus and response module 23, a DC and AC voltage measurement capability was provided enabling voltage measurements to be taken from any of eight input lines or from the analog measurement and/or stimulus buses. This analog stimulus and response module 23 was also capable of optionally controlilng up to four analog stimulus and response extension modules 23' and making measurements through them. The extension modules 23' might for example comprise 16 DC or AC measurement channels and 8 DC voltage outputs. All operations on the extension modules 23' are arranged to be performed under control of the analog stimulus/response module 23 itself.

Similarly, the variable threshold/level digital input/output module 25, in an exemplary practical embodiment, provides 16 discrete digital lines with variable active levels. Each of the 16 discrete lines may individually be configured as an input or as an output under program control, and may be dynamically changed from one to another under program control. When programmed as an input, the thresholds for all the lines may be set to give a minimum voltage level for a logic 1 and a maximum voltage level for a logic 0, to establish test criteria for the lines. Positive logic is assumed throughout, with the restriction that the minimum logic 1 input voltage is always more positive than the maximum logic 0 input voltage, and the logic 1 output voltage is always more positive than the logic 0 output voltage. When programmed as an output the voltage levels for logic 1 output and for logic 0 output may be set under program control for all the lines. Any SYNC may be generated on a 0 to 1 or a 1 to 0 transition on any discrete I/O line (irrespective of whether the line is set up as an input or an output, therefore output transitions as well as input transitions can cause a SYNC), or on a pattern match on the I/O lines. This pattern has a separate ENABLE term, active High, and allows individual bits to be masked in or masked out. Such generated SYNCs may be operated as either one-shot or retriggered, one-shot mode generating a SYNC on only the next pattern match or transition and retriggered mode generating a SYNC on every pattern match or input transition. I/O lines may also be routed onto a SYNC line directly to enable a signature to be taken from the line, using a frequency and Signature analysis module if installed in the system. As with the analog stimulus/response module 23 abovementioned, the variable threshold/level digital input/output module might comprise appropriate arrays of digital:analog converters coupled with threshold/level determining comparators in a logical structure enabling the relationship of an input signal relative to upper and lower limits to be positively determined. The variable threshold/level digital input/output module might utilize window comparator techniques to measure digital levels as true logic levels to their full specification, e.g. logic 1 defined as above X volts, logic 0 defined as below Y volts, with the window comparator set to X and Y volts indicating a level between X and Y as a poor or indeterminate level.

The signature analysis and frequency measurement module 24 will now be described in general and with particularity with reference to FIGS. 5A to 5C, 6A to 6C, 7 and 8. The principal functions of this module reside in waveform recognition for checking the operation of circuit modules etc. and in frequency counting and timing for checking the operation of oscillators etc.

Waveform recognition is commonly effected by digitising the signal waveform and subjecting the digitised signal to a signature analysis or alternatively to a transition counting type of recognition technique. Signature analysis consists of a feedback shift register generating a pseudo-random sequence that is a function of the input signal sequence at specific clocked time intervals. By using a start signal to initialize the shift register and a stop signal to capture the instantaneous pattern of data within the shift register, repeatable patterns are produced for identical data streams enabling recognition of incoming data streams to be effected with data compression. Transition counting uses a digital counter clocked on each transition of an incoming data stream to assemble a count which is repeatable for identical data streams and thus provides a means of data stream recognition which again uses data compression. However, both signature analysis and transition counting techniques for data recognition have disadvantages in that signature analysis does not detect glitches (transients) and transition counting produces very limited result values that provide no distinction between different waveforms having the same number of transitions.

To overcome the above deficiencies the invention proposes to employ a composite arrangement for waveform recognition wherein signature analysis and transition counting techniques are logically combined so as to obtain a more distinctive signature for any particular signal sequence. The invention proposes three alternative ways of logically combining signature analysis and transition counting as illustrated schematically in FIGS. 5A, 5B and 5C of the drawings namely:

(1) FIG. 5A shows a technique of concatenation wherein the incoming data stream is provided both to the signature analysis shift register 50 and to the transition counter 51 and the outputs of these two together constitute the signature proper of the data stream: this technique provides the highest degree of signature distinctiveness but with the need for double length signal processing and storage;

(2) FIG. 5B illustrates a bit-by-bit exclusive OR technique wherein the outputs of the shift register 50 and of the counter 51 are individually tested; this provides a compact system but with a lesser degree of signature distinctiveness; and (3) FIG. 5C illustrates a binary addition technique wherein the outputs of the shift register 50 and of the counter 51 are added in binary adder 52: this provides a compromise between the degree of distinctiveness of the resultant signature and the amount of storage required.

The arrangements of FIGS. 5A, 5B and 5C could be used alone or in combination in an automatic test equipment in accordance with the present invention. Thus for example different channels could be provided in a signature analysis module arranged to perform signature analysis to different degrees of distinctiveness. Such a signature analysis module could even include channels operating in accordance with the conventional signature analysis and/or transition counting methods mentioned above.

In order to provide the greatest degree of signature distinctiveness, the feedback shift registers 50 in the arrangements of FIGS. 5A, 5B and 5C need to provide a maximal length sequence for steady one or zero data inputs. For an n-bit shift register, the maximal sequence length for a linear shift register is $(2^n-1)$. Thus for a 16-bit shift register, a sequence length of 65,535 is preferably used. As will be appreciated by those possessed of the appropriate skills, there are numerous feedback arrangements that can provide this sequence length and FIGS. 6A, 6B and 6C illustrate three minimal complexity arrangements which can be used; the operation of these arrangements will be clear without need for further explanation, it being seen that the incoming bits of the data stream are exclusive OR gated with the output of a second exclusive OR gate having inputs from selected shift register positions. In FIGS. 6A, 6B and 6C the shift register is designated 60, the first exclusive OR gate is designated 61 and the second exclusive OR gate is designated 62.

FIG. 7 illustrates an exemplary arrangement for frequency drift detection which may conveniently be included in the signature analysis and frequency counter/timer module 24 of FIG. 1A or in any other module. As shown, a counter 70 is used to count the number of clock transitions, for example of a clock frequency under test, occurring in a predetermined timebase window. The counter output is then stored progressively in latch circuits 71 and 72 every N measurement window periods (N being a number dependent upon the percentage change in frequency to be regarded as a frequency drift), and the counts stored in latches 71 and 72 are compared in comparator 73. The comparator 73 provides a true or false indication of drift, with a small tolerance acceptable due to jitter in the counts since the frequency under test will be asynchronous with the timebase measurement window.

The same hardware arrangement as is shown in FIG. 7 may also be employed for missing pulse detection with the frequency under test input replaced by a high frequency clock and the timebase window replaced by the input pulse train divided by two. With N set to equal unity, the comparator will indicate if a pulse has been missed by showing differences in pulse separation.

FIG. 8 is a schematic circuit diagram of an exemplary practical realisation of a frequency and signature analysis module which consists of two identical circuits that can be configured in a variety of ways to perform a multiplicity of tasks. The tasks and the configuration required are as follows:

(1) Frequency and waveform period measurement—The circuit is configured by the system processor such that the clock input multiplexer 180 selects a pulsed input of sufficient frequency to give an acceptable accuracy and resolution to the measurement to be performed. The set and reset input multiplexers 181 and 182 respectively are configured to route the required signal to the set and reset terminals of the single period detector 183. The set and reset edge polarity signals applied to exclusive OR gates 184 and 185 must be the same. After an initial reset to the single period detector 183 and initialising of the programmable counter 186 via software control, the first edge of the signal to be measured (via the set I/P) will cause the output of the single period detector 183 to enable the programmable counter 186 which will be decremented by the clock input. When the second edge of the signal to be measured occurs, via the reset input, the output of the single period detector 183 will go low and remain low regardless of what occurs on its set/reset inputs. Once the output has gone low, the programmable counter 186 will cease counting and the resultant count is proportional to the period and therefore proportional to 1/frequency. High accuracy frequency measurement can be achieved by the technique of measuring the period of a number of cycles accurately, allowing an optimal trade-off between accuracy and speed of measurement.

(2) Phase difference—the circuit is configured as for frequency/period measurement but with the set input multiplexer 181 and the reset input multiplexer 182 selected for different inputs. The resulting count will be proportional to the difference in time (and hence phase) between the selected edges of both waveforms. Alternatively the signal period interval and the interval between repective zero crossings of the signals can be measured, the phase difference between the two signals being calculated from the ratio of the two results.

(3) Pulse width—the circuit is configured as for (1) but with reset edge polarity set to the opposite of the set edge polarity, e.g. if the set edge polarity input is configured for a rising edge trigger and the reset edge polarity input configured for a falling edge trigger, the counter 186 will be active only whilst the signal is high and the resultant count will be proportional to pulse width.

(4) Counter (or transient signature analysis)—the circuit is configured so that the clock input multiplexer 180 routes the signal line to be monitored to the clock input of the programmable counter 186, and so that the "set" and "reset" become the start and stop control signals for the counter 186. The resulting count will equal the number of pulses on the monitored input between the start and stop signals. If the start and stop signals were the same as for the state signature analysis described below, then the count could be regarded as a transition signature (as described hereinbefore).

(5) State signature analysis—When the set and reset multiplexers 181, 182 are set to provide an enable pulse to the counter 186 the enable will simultaneously enable a 16 bit feedback shift register 187 to characterise the data stream presented to its input.

(6) Missing pulse detection—this can be achieved in two ways
(a) by configuring as a counter and comparing successive readings; and
(b) by setting a frequency, less than or equal to the pulse train to be monitored, on the clock line to the 16 bit feed back shift register 187 and applying the pulse train to be monitored to the data input, the output of the binary counter 188 will go high indicating a missing (or number of missing) pulses.

(7) Short term drift—by comparison of successive results for any particular function, drift, be it short term or otherwise, can be monitored.

When such a module is provided in the automatic test equipment, the inclusion of sync lines and the analog measurement bus allows cascading of timing function, for example the timing of four consecutive wave periods for very short term drift or jitter analysis. It is to be particularly understood that the above description relates to an exemplary frequency and signature analysis module and that many different and varied configurations providing the same or different facilites could be provided and that the same functions obtained by the hardware described could be obtained by means of software control.

The automatic test equipment can further comprise a sequence emulator module providing a plurality of digital input/output bits individually configurable as inputs or outputs capable of bursts of real-time activity. The purpose of the sequence emulator is to provide patterns of data at real-time and to capture data from a circuit under test. The emulator module can also be used as a logic state analyser or programmable pattern generator. FIG. 9 shows a simplified block diagram of an exemplary emulator according to the invention with the means of loading and retrieving data into and from the RAM omitted for clarity. In operation of the illustrated arrangement, the sequence controller 80 provides RAM addresses in the order required for a given sequence, the RAMs are then read and their data held in latches 81, 82 and 83. Data from the control RAM 85 is used to determine whether the respective data line is to be used as an input or as an output. If the data line is to be configured as an output, both of the tristate buffers 87 and 88 are enabled and the data from latch 83 appears on the data line. If the data line is to be configured as an input, only buffer 88 is enabled. At the end of a cycle a "write" operation is performed on the data RAM 86 which captures data from the data line if the line is an input and otherwise rewrites its previous contents via a wrap-around of the data from latch 83. This wrap-around feature can provide the advantages of a reduction in RAM requirement as the same RAM may be used for both input and output data, and provides a self test of the system. Additionally it allows for any data line to be an input, an output, or both as a bidirectional line. FIG. 10 illustrates the timing. As an alternative to the described wrap-around feature, separate data-in and data-out RAM's may be provided.

The sequence controller 80 in FIG. 9 can be either simple or complex. In its simplest form it might consist of a counter producing sequential addresses and some logic to indicate start and finish of sequences, and need not include a sequence RAM. In a more complex form the sequence controller might for example be structured as a microprogram controller providing for example, subroutines of test sequences, conditional testing and looping test sequences, and/or variable length cycle periods, all powerful and useful test facilities.

FIG. 11A illustrates a modification of the FIG. 9 arrangement according to which the expected data from an input may be loaded into the data RAM 86 to be read out into latch 83 and compared with incoming data using an exclusive OR gate 89. The output level of gate 89 then will be indicative of whether or not a given state has been reached or the test passed. If this level were to be fed into the sequence controller as a jump condition, it would then be possible to wait for the occurrence of a given event. Alternatively, if this level were arranged as in FIG. 11B to be fed back to data RAM 86, then the data RAM would contain a signature matrix with logic one's indicating tests which have failed.

Treating the control and data RAM contents as matrices, with elements indexed by bit number and RAM address and referred to as CM and DM respectively, and with a 1 in CM corresponding to an input and a 0 corresponding to an output, then if R is the corresponding matrix of expected data, the signature matrix S may be defined as:

$$S = (CM.AND.DM).XOR.R$$

where .AND. and .XOR. represent respectively the bit-by-bit logical AND and exclusive-OR of corresponding matrix elements. If the arrangement of FIG. 11B is used, then the data RAM 86 will contain the signature matrix at the end of an operating sequence. If S is a NULL matrix, the sequence of tests has been passed; otherwise it will contain complete information as to the failures that have occurred for use in diagnostic processing.

Referring now to FIGS. 12A through 12D, these illustrate an emulator sub-system constituting the modules 27 and 27' in FIG. 1B.

The emulator sub-system provides high speed parallel digital input/output and gives a combination of data output and data capture. This may be used for pattern generation, logic state analysis and microprocessor emulation. For pattern generation the emulator acts as output only, generating sequences of parallel patterns. In a logic state analysis mode the emulator acts in an input only mode capturing parallel data as a function of time or external clock. In a microprocessor emulation mode the emulator acts as a combination of input and output simultaneously, with lines able to change between input and output dynamically. The actual microprocessor emulation sequence is based on the emulation of the following primitive microprocessor bus cycles:

Memory Read
Memory Write
I/O Read
I/O Write
Opcode Fetch
Interrupt Acknowledge or any other type of cycle required.

These cycles may be individually actioned, giving bursts of real-time bus activity, or strung together to give lengthy sequences of real-time activity.

The emulator itself, as shown in FIG. 12A, is split into two interface module types, a "Master Emulator" for sequence control and a "Slave Emulator" for data lines, and a separate "Pod" for microprocessor signal buffering and close tolerance timing. One Master Emulator Module (FIG. 12C) may control up to four Slave Emulators (FIG. 12D), via a daisy chained ribbon cable, requiring Slave Emulators to be installed adjacent to their controlling Master Emulator. More than one Master Emulator may be installed, each with their associated Slave Emulators.

The Master Emulator module (FIG. 12C) provides the control circuitry for up to four Slave Emulator modules and as such only has one direct input line for an external clock. The module provides sequencing of the pattern steps to the Slave Emulators and responds to the detection of comparisons or "stuck-at" faults on the Slave Emulators. The step rate between patterns is determined by the Master Emulator as either 8 MHz or 10 MHz, or by an external clock of up to 10 MHz which allows synchronisation with the unit under test (UUT). The following control operations are provided:

1. Run emulator from one step to another.
2. Start run on SYNC, Trigger Pattern (from word comparators on the Slave Emulators) or under direct program Control.
3. Stop run on SYNC, Trigger Pattern, mismatch of UUT states, any step number or under direct program control. The module also records the step number of any mismatches and a total count of mismatches as a fast means of checking a UUT response. (A total of 2048 mismatch step numbers may be stored).

The Slave Emulator module (FIG. 12D) provides 16 high-speed RAM backed digital I/O lines. Each line may be changed from input to output or vice-versa dynamically. The module contains RAM sufficient for 2048 patterns of information on each line and may be stepped between patterns using a minimum pattern step of 100 ns. Each I/O line is protected against misuse by a series thermistor. Additional features include self-checking of the output lines to detect "stuck-at" faults and a word comparator allowing each line to be compared with a stored word which may be selectively, bit masked.

The emulator subsystem thus brings together two techniques, namely bus cycle emulation and RAM behind the pins function testing. Bus cycle emulation emulates the relatively few types of data transfer instructions that a processor performs and functional testing with RAM behind the pins involves injecting patterns into a board from an array of RAMs. As shown in FIG. 12B the data in the RAMs is structured in such a way that there is a segment containing the pattern or pattern sequence corresponding to each of the data transfer instructions, and the test program (software) decides which of the segments to output depending on which data transfer it is desired to emulate. The pattern sequence to emulate a data transfer instruction may be formed from a set of micro-instructions in the emulator RAMs, such codes defining the states of individual signal lines in the sequence required to mimic the microprocessor being emulated.

Referring to FIG. 12D (the slave) wherein only one digital I/O line and associated circuitry is shown, it can be seen that each emulator line is backed by three 2K RAMs 221, 222 and 223. RAM 221 provides the stimulus patterns, RAM 222 collects the response and RAM 223 controls the direction of the buffers 224 "on the fly" for each clock state in dependence upon whether the line should be reading or writing.

The address lines of the RAMs are driven in parallel from a counter which in turn is normally clocked by the UUT (unit under test) clock. This provides the possibility of a new pattern for each clock state of the unit under test (UUT).

Comparators 225 are provided to detect differences between data from the UUT and data from the stimulus RAM 221. This can be used for (a) checking for stuck faults on the UUT when in a write state and (b) comparing received data from the UUT with expected data stored in the stimulus RAM 221 when in a read state.

A comparator 226 is also provided to compare patterns on the emulator lines with a preset word and the result of this is fed back to the MASTER for control purposes, e.g. for SYNC generation, or for starting or stopping the run.

FIG. 13 illustrates a patch switching relay marix arrangement whereby a plurality of circuit nodes designated 1 ... N may be selectively accessed for measurement and/or stimulus pruposes. Each node has four switchlines individually associated with it by means of respective change-over switches 110 as shown, and first and second selector switches 111 and 112 provide for a variety of connections to the nodes. Switch 111 as shown enables a measurement at a respective node, selected by operation of a respective one of switches 110, to be made relative to ground, to stimulus line 3, to stimulus line 4 or to isolated line 2. Switch 112 provides for the loading of components or interconnection of signal sources, to name but two exemplar possibilities. The arrangement shown by utilizing threaded through chains of switches 110 in the lines 1 to 4 provides safety against shorting of test nodes one to another, provides the possibility of utilizing floating loads and floating measurements, and enables loads and/or signal stimuli to be applied across the nodes. If desired, line 2 could be omitted if measurement relative to an isolated line is not required. In a practical embodiment of relay matrix module, a relay switching matrix of 10 lines to 4 lines is provided for general purpose use. There are 4 'Y' type lines and 10 'X' type lines in the matrix. Individually conrolled relay switches are located at each crossover node between the X and Y lines enabling any combination of connections to be set up between any X line, or lines, and any Y line, or lines. As relays are used as the switching elements the lines can be used for fan-in or fan-out applications.

Two types of bed-of-nail jigs can be used to complement the function test system according to the invention and to enable rapid and reliable connection to printed circuit board assemblies. A first type of jig is a "passive" jig which simply provides a straightforward means of connecting a printed circuit board or other unit under test (UUT) to the interface connectors of the test system, the passive jig comprising a vacuum operated device for probing predetermined circuit nodes of the UUT by means of pin arrays which are interchangeable to suit the particular unit under test, the respective pins of the array being coupled via one-to-one conductors to the test system. Such passive type bed-of-nails jigs are known in the art. The invention contemplates the use also of a second jig type, an "active" jig, which provides all of the functions of the passive jig and in addition provides an automatic probing facility equivalent to rapid manual probing, plus a limited in-circuit measurement capability.

FIG. 14 of the accompanying drawings schematically illustrates the switching operations which can be performed by the active jig, and FIGS. 15A and 15B show equivalent circuits for explaining the principles of impedance and resistance measurement by means of the active jig. The active jig illustrated enables up to 160 nails (each contacting a circuit node of a UUT) to be individually switched to three common lines via software control. These three common lines, designated I, II and III in FIG. 14, are used for stimulus, measurement reference, and measurement purposes respectively. Stimulus (line I) is derived, through buffering, from the analog stimulus bus of the system or from a current source 140 provided within the active jig itself in dependence upon the condition of a relay switch 141. The current source 140 provides a means for limited in-circuit component measurement. Common line II comprises a reference line for measurement and may be utilized to enable differential voltage measurement between circuit nodes or to enable single ended measurement with the line II connected to signal ground, the relay switch 142 enabling selection under software control between the two nodes. The measurement line III enables voltage measurement and includes a potential divider/variable gain stage 143 under software control to enable a wide voltage measurement range, the voltage to be measured being routed onto the analog measurement bus within the overall system. Common line III can also be used as a guard line when making in-circuit type measurements. The current injected when a voltage source is being used as a stimulus input on line I can also be measured by virtue of the provision of resistance 144.

When used for in-circuit type measurement the active jig may be used in one of two ways, firstly an AC or DC voltage can be applied across two nodes and the resulting current measured to give an impedance measurement with common line III providing guarding. The equivalent circuit of this mode is shown in FIG. 15A. Secondly, a constant DC current can be injected as illustrated in FIG. 15B to allow straightforward resistance measurement. Between these methods resistors, capacitors, inductors and diode or transistor junctions may be checked requiring the Analog I/O and Sine Function Generator Interface modules to be present in the system for full capability. The routings provided within the system between such an active jig and the analog stimulus and measurement buses can further enable the use of impedance measurement over a range of frequencies, or frequency sweep, to characterize a parallel circuit element and thus enable different parallel elements to be analysed according to their different frequency responses. Also techniques can be used involving the separation of impedances measured with positive and with negative current flow to identify junctions in such parallel circuit elements. The use of network descriptive algorithms to represent the characterization may also be used.

Hereinafter described in a manufacturing defects analyser module (not illustrated in FIG. 1B) designed to enable in-circuit testing of a circuit board assembly for determination of manufacturing defects such as short circuits, tracking faults, mis-inserted and/or missing and/or out of tolerance components, and the function of individual integrated circuits, etc. rather than for functional testing of the circuit board assembly as a whole. In addition to there being a requirement for full functional testing of circuit board assemblies etc., which is the principal function of the automatic test equipment hereinbefore described, there also exists a need for relatively inexpensive testing apparatus designed to enable manufacturing defects to be identified prior to full functional testing. This need stems from the fact that it has been found that by far the majority of functional faults originate as manufacturing defects such as those mentioned above. An acceptance rate of 90% and above can be obtained on full functional testing if a preliminary rudimentary fault location is effected based upon location of manufacturing defects. The provision of a manufacturing defects analyser module can thus usefully complement and enhance the utility of the automatic test equipment according to the invention.

Referring to FIG. 16 which schematically illustrates a bidirectional switching network utilised in the manufacturing defects analyser (MDS) module, the network will be seen to comprise four bidirectional switches designated 231, 232, 233 and 234 interconnected as shown with each other and with source +, source −, test point (node) and two separate measurement terminals designated 235 to 239 respectively. Control terminals 240 and 241 also are provided respectively for determining the operation of the switches 231 and 232 and the switches 233 ,234. By selection of control terminal 240, for example, switches 231 and 232 can be rendered conductive so as to connect test point (node) 237 to the stimulation source + terminal 235 and to the "positive" measurement terminal 238. If control terminal 241 is selected, then switches 233 and 234 are enabled to connect the test point (node) 237 to the source − terminals 236 and to the "negative" measurement terminal 239.

The network shown in FIG. 16 is but one of a large number of parallel-connected networks each individually addressable via its control to connect its respective test point (node) either to the stimulus source + terminal 235 and to measurement terminal 238 or to the source − (reference) terminal 236 and to measurement terminal 239. A component on a printed circuit board, for example a resistor whose resistance is to be verified as being within specified tolerances of its nominal value, can be contacted at one of its ends by means of a probe or a pin of the aforementioned active or passive jigs coupled to the test point (node) of any one switching network and can be contacted at its other end by means of a probe or jig pin coupled to the test point (node) of any other switching network, and the two switching networks in question can be controlled by appropriate addressing of their control terminals so that one test point (node) coupled to one end of the resistor is coupled to the stimulus source (for example a constant current generator provided in the MDA module or the analog stimulus bus of the automatic test equipment) and to one terminal of a voltage measurement device provided in the MDA module or coupled to the analog measurement bus, and the other test point (node) coupled to the other end of the resistor is coupled to ground and to another terminal of the voltage measurement device. A current pulse supplied from the stimulus source to ground via the resistor will set up a corresponding voltage across the resistor which can be measured by the voltage measurement device to enable the resistance value of the resistor to be computed and, as desired, compared with its nominal value to enable a decision to be taken as to whether or not is resistance value is within an acceptable tolerance range of the nominal value. As will be well understood, the addressing of the control terminals of the switching networks, the timing and the nature of the stimulus applications and of the measurements may advantageously be under control of the computer in the automatic test equipment so that a multiplicity of components in a printed circuit board for example may be tested automatically in accordance with a preprogrammed routine.

FIG. 17 shows the actual make-up of the switching network of FIG. 16. As shown in FIG. 17 each of the switches 231, 232, 233, 234 comprises a bidirectional analog transmission gate, and the four gates are connected as shown to define two control terminals 240 and 241 coupled via inverters to the gate electrodes of respective pairs of the gates 231, 232, 233, 234.

With the arrangement shown in FIG. 17 and with a resistor, for example, to be tested coupled between test points TP1 and TP2, the application of an input to control terminal 240 of the switching network associated with test point TP1 such as to render switches 231 and 232 of that network bidirectionally conductive, and the application of a corresponding input to control terminal 241 of the switching network associated with test point TP2 such as to render switches 233 and 234 of that network bidirectionally conductive, will enable a current pulse to be passed through the resistor and the corresponding voltage developed across the resistor to be measured between measurement nodes 238 and 239. In similar manner, other components such as capacitors, inductors, diodes transistors etc. can be tested by application of selected current/voltage/frequency stimuli and/or combinations thereof and observation of the resultant current/voltage response of the respective components.

FIG. 18 shows the general circuit arrangement of an exemplary MDA module according to the present invention. Reference numeral 251 designates a multiplexer comprising a plurality of the switching networks described above with reference to FIGS. 16 and 17, the multiplexer 251 having associated therewith address buses designated 240' and 241' for computer controlled addressing of the control terminals 240 and 241 of the switching networks and further having terminals 235', 236', 238', and 239' corresponding respectively to the source + terminal 235, the source − (reference) terminal 236, and the respective measurement terminals 238 and 239 of the switching networks. The source terminals 235' is selectively connectable via a switching device 252 controllable from the central processing unit (not shown) of the automatic test equipment system with voltage, current and frequency sources 253, 254 and 255 respectively all comprising integral parts of the module or derived from the analog stimulus bus of the automatic test equipment system, and with an external terminal. A standard resistor 256 in the voltage source line enables high value resistors to be measured. The measurement terminals 238',239' of the multiplexer 251 are coupled to an instrumentation amplifier generally designated 257 comprising high impedance buffers 258 and a differential amplifier 259, and the output of the instrumentation amplifier 257 is coupled via a two way switch 266 to a window comparator arrangement 260 for comparison with "high" and "low" reference levels $V_H$ and $V_L$ in order to provide corresponding inputs to logical circuitry 261 providing "high", "in" or "low" outputs representative of the relationship of the measured value of the component in question to a predetermined tolerance range associated with an acceptable component.

The output of the instrumentation amplifier 257 is also applied to a display databus 262 via an analog-to-digital converter 263 fed via a switching device 264 controllable from the central processing unit with either the direct output of the instrumentation amplifier 257 or with the output of an RMS-DC converter 265. The switch 264 is also connnected to receive a signal representative of the voltage $V_i$ derived across test resistor 256 aforementioned in order to measure source currents.

A digital-to-analog converter 267 enables a negative reference voltage V− to be selectively applied via two way switch 268 to the reference terminal 236' of multiplexer 251, the D-A converter 267 and the switch 268 being controllable from the central processing unit of the automatic test equipment apparatus.

FIG. 19 is a general representation of the combination of an MDA module with an automatic test equipment system according to the present invention and is useful for understanding the philosophy underlying the inventive combination. The multiplexer 251 above described is shown providing a plurality of measurement nodes 1,2,3, . . . N, as well as the control terminal selection input buses 240',241', and the source, reference (ground) and two measurement nodes 235',236',238' and 239' aforementioned. The measurement system, designated 260, as more particularly described with reference to FIG. 18 responds to input data from the central processing unit (not shown) of the system regarding the measurement type (e.g. voltage stimulus, current stimulus, frequency stimulus), the duration of any stimulus pulse to be employed, the time at which any measurement is to be effected, and high and low thresholds to be compared with measured values, and as the result of a measurement effected upon a component is capable of providing measured value outputs and a component status indication.

Whilst various specific arrangements have been described herein and illustrated in the accompanying drawings it will be clear to the reader possessed of relevant skills that such specific arrangements are exemplary only and that various modifications and alterations could be made without departure from the general ambit of the invention which is to provide a modular automatic testing equipment which has the facility to enable a user to configure the equipment to suit his particular purpose by selection of the appropriate interface modules from a set of standard modules. For cases where a standard interface module is not available or is not suitable for the desired application, a standard prototyping board interface module may be provided with a limited amount of already installed circuitry enabling the user to design and build his own module from a starting point of easy application design into the system backplane signal structure.

The system could further be modified for example so as to include a facility for handling out of range sensed variables such as by means of software controlled potential dividers of preset scaling factor being called into operation as and when appropriate; such a facility could be provided in association with both direct and opto-isolated input/output lines.

What is claimed is:

1. Automatic test equipment for the functional testing of electronic circuits, said automatic test equipment comprising:
   a programmable controller comprising a digital computer having keyboard and display facilities;
   first means for the connection to said programmable controller of a number of testing devices such as power supplies and external specialist instrumentation;
   second means for the connection to said programmable controller of a user configured number of optional testing devices, said second means comprising a plurality of function module connection sites provided in the automatic test equipment with each of said connection sites being capable of receiving any one of a plurality of different function modules of predetermined type designed to be controlled by the controller;
   a user-configured selection of optional function modules comprising a plurality of such modules received in selected ones of said connection sites, each of said optional function modules being adapted to be controlled by the controller in the performance of predetermined specific circuit testing operations and including means to enable the function module type, as regards its functional capability, to be determined by the controller;
   connector means for coupling said plurality of function modules to an electronic circuit to be tested; and
   a bus structure interconnecting said plurality of function module connection sites with each other and with said programmable controller in a shared resource arrangement providing for direct moduleto-module communication, said bus structure comprising:

(i) a computer databus for communicating control data from the controller to the function modules for controlling the operation of the function modules and for passing digital data to and from the function modules;

(ii) a function module indentification bus for enabling the controller to identify individual function module types and ascertain their locations in said plurality of module connection sites;

(iii) analog stimulus and analog measurement buses enabling the sharing of analog resources within the automatic test equipment by direct communication between function modules received in said connection sites of analog stimulus and response signals; and (iv) a synchronization bus comprising a plurality of sync/digital common lines for enabling direct module-to-module communication for cross-synchronization of events occurring within the automatic test equipment.

2. Automatic test equipment as claimed in claim 1 wherein said optional function modules include at least one frequency measurement module.

3. Automatic test equipment as claimed in claim 2 wherein the frequency measurement module includes a frequency shift detector comprising a counter arranged to assemble a count of the number of cycles of an incoming frequency signal occurring within a set measurement period, first and second latches serially connected to the counter output, means for transferring the count accumulated in said counter to said first latch and for transferring the contents of said first latch into said second latch once every N measurement periods, N being an integer of at least one, and a comparator for comparing the contents of the latches one with the other and providing an output indicative of detected differences.

4. Automatic test equipment as claimed in claim 1 wherein the keyboard includes a plurality of special function keys the operations of which are changeable under software control and the display facility is arranged to provide to a user an indication as to the current functions of said special function keys.

5. Automatic test equipment as claimed in claim 4 wherein said special function keys are each distinctively coloured and the display facility is arranged to include a correspondingly coloured indicia in the indication provided to a user of the current function of each special function key.

6. Automatic test equipment as claimed in claim 1 wherein said display facility includes a light pen and the microcomputer is arranged to enable a user to draw in signal sequences and waveform shapes to be used in the testing of an electronic circuit.

7. Automatic test equipment as claimed in claim 1 wherein, in order to enable the controller to determine the type of function module associated with any of said module connection sites, type identifying code means are associated with each of said modules, and said controller is arranged for interrogating said module connection sites to ascertain the nature of the code means associated with modules received therein whereby to assemble in said controller a map indicating what module type is received in which connection site.

8. Automatic test equipment as claimed in claim 1 wherein said optional function modules include at least one multi-bit digital input/output module wherein a plurality of signal lines are individually configurable selectively as one of an input and an output and are dynamically changeable through operation of the programmable controller.

9. Automatic test equipment as claimed in claim 8 wherein said multi-bit digital input/output module is user configurable through operation of the programmable controller for determined threshold levels for logic one and logic zero inputs and outputs.

10. Automatic test equipment as claimed in claim 1 wherein said optional function modules include at least one isolated logic digital input/output module providing a plurality of opto-isolated logic inputs and a plurality of single-pole single-throw isolated relay switch outputs.

11. Automatic test equipment as claimed in claim 1 wherein said optional function modules include at least one digitally controllable programmable waveform generator module for generating user definable analog waveform shapes for use as circuit testing inputs.

12. Automatic test equipment as claimed in claim 11 wherein said digitally controllable programmable waveform generator module comprises a random access memory device the data contents whereof can be loaded by a user through operation of the controller, a variable rate clock generator controllable in dependence upon a user determinable digital signal, a counter driven by the output of said variable rate clock generator and providing a control input to said random access memory device, a latch circuit coupled to the output of said random access memory device, and a multiplying digital-to-analog converter coupled to the output of said latch circuit and having a multiplying factor which is controllable in dependence upon a user determinable digital signal.

13. Automatic test equipment as claimed in claim 12 wherein a user-selectable read only memory device is provided in parallel with said random access memory device and is preprogrammed with a plurality of predetermined standard waveform shapes.

14. Automatic test equipment as claimed in claim 12 wherein first and second counters are provided and each is capable of independently controlling the operation of a said random access memory device, the arrangement being such as to enable the generation of first and second signals having a phase interrelationship determined according to the user controllable setting of said first and second counters.

15. Automatic test equipment as claimed in claim 1 wherein said optional functional modules include at least one analog stimulus/response module.

16. Automatic test equipment as claimed in claim 15 wherein said analog stimulus/response module is arranged to be digitally controllable by a user through operation of said controller and comprises a plurality of digital-to-analog and analog-to-digital converter channels.

17. Automatic test equipment as claimed in claim 1 wherein said optional function module include at least one module adapted for waveform analysis and signal sequence recognition.

18. Automatic test equipment as claimed in claim 17 wherein said waveform analysis and signal sequence recognition module is adapted to perform at least one of a signature analysis technique, a transition counting technique, and a logically combined signature analysis and transition counting technique.

19. Automatic test equipment as claimed in claim 18 wherein an incoming data stream to be recognized by said module is supplied to a feedback shift register adapted to generate a pseudo-random sequence that is a function of the input data stream at specific clocked time intervals, and is also supplied to a digital counter arranged to be clocked in response to transitions of the incoming data stream, and the outputs of said feedback shift register and said digital counter are combined to constitute a recognizable signature.

20. Automatic test equipment as claimed in claim 19 wherein the outputs of said feedback shift register and of said digital counter are combined by one of a process of concatenation, a process of bit-by-bit exclusive OR gating, and a process of bit-by-bit addition.

21. Automatic test equipment as claimed in claim 19 wherein said feedback shift register is arranged to provide a maximal length sequence for steady one or zero data inputs.

22. Automatic test equipment as claimed in claim 17 wherein said waveform analysis and signal sequence recognition module comprises a plurality of data inputs; a CLOCK input multiplexer, a SET input multiplexer, and a RESET input multiplexer coupled to said data inputs; a single period detector having a SET input coupled to the output of the SET input multiplexer and a RESET input coupled to the output of the RESET input multiplexer; a programmable counter having a CLOCK input coupled to the output of the CLOCK multiplexer and having an ENABLE input coupled to the output of the single period detector; and a feedback shift register coupled to the output of the programmable counter and having an ENABLE input coupled to the ENABLE input of the programmable counter, a CLOCK input, and a TEST DATA input.

23. Automatic test equipment as claimed in claim 22 wherein edge polarity determining gating means are coupled between the outputs of the SET and RESET multiplexers and the SET and RESET inputs of the single period detector.

24. Automatic test equipment as claimed in claim 22 wherein a binary counter providing a missing pulse detection output is coupled to receive the ENABLE input from the single period detector, the CLOCK input to the feedback shift register, and a CLEAR input coupled to the TEST DATA input of the feedback shift register.

25. Automatic test equipment as claimed in claim 1 wherein said optional function modules include at least one switching module enabling selected circuit nodes of a unit under test to be accessed selectively for measurement and stimulus purposes.

26. Automatic test equipment as claimed in claim 1 wherein said optional function modules include at least one active jig interface module for connection to a unit under test by means of a bed-of-nails type of testing jig, said active jig interface module comprising a plurality of controllable switches for coupling circuit nodes of a unit under test to respective ones of measurement, stimulus and reference lines.

27. Automatic test equipment as claimed in claim 1 wherein said optional function modules include at least one real time sequence emulator module providing a plurality of bits of digital input/output individually configurable as inputs or outputs capable of bursts of real time activity.

28. Automatic test equipment as claimed in claim 27 wherein said real time sequence emulator module comprises a digital sequence controller, a sequence random access memory device and an associated latch in a circulatory data path with said sequence controller, a control random access memory device, a data random access memory device, means for loading and retrieving data into and from said random access memory devices, a second latch associated with said control random access memory device, a third latch associated with said data random access memory device, a first gating device operable to condition an output of said first latch as an output to a data line, a second gating device operable to enable data from said data line to be written into said data random access memory device and into said third latch, and direction control logic for determining the condition of said gating devices in dependence upon an output from said second latch, said sequence controller being arranged to provide random access memory device addresses to said control and data random access memory devices for determining the operation thereof.

29. Automatic test equipment as claimed in claim 28 wherein means are provided for comparing data outputted by said third latch with data incoming from said data line, the arrangement being such that data corresponding to that expected from an input may be loaded into the data random access memory device and therefrom into the third latch for comparison with actual incoming data, the output of said comparing means thereby being indicative of the relationship between the actual and expected data.

30. Automatic test equipment as claimed in claim 19 wherein the output of said comparing means is coupled as an input to said data random access memory device for assembling therein a signature matrix indicating success or failure of circuit tests.

31. Automatic test equipment as claimed in claim 27 wherein said emulator module comprises a master emulator and a plurality of slave emulators controlled by the master emulator, the master emulator comprising control circuitry for up to a predetermined number of slave emulators and the slave emulators each comprising a plurality of RAM backed digital input/output lines each dynamically changeable between input and output states.

32. Automatic test equipment as claimed in claim 31 wherein each digital input/output line of a slave emulator is backed by a stimulus RAM for providing test stimulus data patterns, a response RAM for collecting responses from a unit under test, and a direction control RAM for determining the reading and writing states of the respective line.

33. Automatic test equipment as claimed in claim 32 wherein the slave emulator modules further comprise comparators for effecting at least one of detecting differences between data received from a unit under test and data received from a respective stimulus RAM, and comparing data patterns on the slave emulator input, output lines with at least one predetermined data pattern.

34. Automatic test equipment as claimed in claim 27 wherein said sequence emulator module comprises a random access memory structure for storage of microprocessor emulation data and micro-instruction codes are stored in said random access memory structure, said codes defining the data transfer instructions of the microprocessor to be emulated.

35. Automatic test equipment as claimed in claim 34 wherein said random access memory structure comprises stimulus, response and direction control RAM's and said micro-instruction codes comprise sequences of patterns stored in said RAMs for defining the stat of individual signal lines in the sequence required for the respective emulation.

36. Automatic test equipment as claimed in claim 1 wherein at least one of said optional function modules comprises a manufacturing defects analyzer module for testing the viability of components on a printed circuit board, said module including an array of bidirectionally current conducting switching networks each defining a test point for connection to a node of printed circuit board under test and connectable by control of the respective switching network selectively to one of a stimulus source and a reference potential and simultaneously also to a corresponding input of a measurement facility.

37. Automatic test equipment as claimed in claim 36 wherein said switching networks each comprise four bidirectionally current conducting analog switches each comprising a control electrode to which an input may be applied for determining the current conduction condition of the respective switch, a first of said switches having its current conduction path connected between a stimulus source terminal and the respective test point and its control electrode connected to a first selection terminal, a second of said switches having its current conduction path connected between said test point and a reference potential terminal and its control electrode connected to a second selection terminal, a third of said switches having its current conduction path connected between said test point and a first measurement terminal and its control electrode connected to a third selection terminal, and a fourth of said switches having its current conduction path connected between said test point and a second measurement terminal and its control electrode connected to a fourth selection terminal.

38. Automatic test equipment as claimed in claim 37 wherein said first and said third selection terminal are commonly connected, and said second and said fourth selection terminal are commonly connected.

39. Automatic test equipment as claimed in claim 38 wherein said switches each comprise a bidirectional analog transmission gate.

40. Automatic test equipment as claimed in claim 1 in combination with one or more signal measurement and/or injector probes including an integral display for indicating to a user of the equipment information such as, for example, a designation of the next point to be probed in a sequence controlled by the system software.

41. Automatic test equipment as claimed in claim 1 adapted and arranged such that, in operation of the equipment, the equipment provides a user of the equipment with a sequence of instructions derived on a question and answer basis and designed to lead the user through the operations required for creating a required interface with a unit under test and defining the required test program.

42. Automatic test equipment as claimed in claim 1 including means responsive to the manual representation by a user of the equipment of a test signal to be utilized in the operation of the equipment for deriving a corresponding test signal.

43. Automatic test equipment as claimed in claim 42 wherein said means for deriving a test signal corresponding to a manual representation of a user comprises a light pen and a graphics facility utilizable with said light pen.

44. Automatic test equipment for the functional testing or electronic circuits, said automatic test equipment comprising:
 a programmable controller comprising a digital computer having keyboard and display facilities;
 first means for the connection to said programmable controller of a number of testing devices such as power supplies and external specialist instrumentation;
 second means for the connection to said programmable controller of a user configured number of optional testing devices, said second means comprising a plurality of function module connection sites provided in the automatic test equipment with each of said connection sites being capable of receiving any one of a plurality of different function modules of predetermined type designed to be controlled by the controller;
 a user-configured selection of optional function modules comprising a plurality of such modules received in selected ones of said connection sites, each of said optional function modules being adapted to be controlled by the controller in the performance of predetermined specific circuit testing operations and including means to enable the function module type, as regards its functional capability, to be determined by the controller;
 connector means for coupling said plurality of function modules to an electronic circuit to be tested; and
 a bus structure interconnecting said plurality of function module connection sites with each other and with said programmable controller in a shared resource arrangement providing for direct module-to-module communication, said bus structure comprising:
  (i) computer databus for communication control data from the controller to the function modules for controlling the operation of the function modules and for passing digital data to and from the function modules; and
  (ii) a function module identification bus for enabling the controller to identify individual function module types and ascertain their locations in said plurality of module connection sites.

45. Automatic test equipment as claimed in claim 44, said bus structure further comprising a synchronization bus comprising a plurality of sync/digital common lines for enabling direct module-to-module communication for cross-synchronization of events occurring within the automatic test equipment.

46. Automatic test equipment as claimed in claim 44, said bus structure further comprising analog stimulus and analog measurement buses enabling the sharing of analog resources within the automatic test equipment by direct communication between function modules received in said connection sites of analog stimulus and response signals.

47. Automatic test equipment for the functional testing of electronic circuits, said automatic test equipment comprising:
 a programmable controller comprising a digital computer having keyboard and display facilities;
 first means for the connection to said programmable controller of a number of testing devices such as power supplies and external specialist instrumentation;

second means for the connection to said programmable controller of a user configured number of optical testing devices, said second means comprising a plurality of function module connection sites provided in the automatic test equipment with each of said connection sites being capable of receiving any one of a plurality of different function modules of predetermined type designed to be controlled by the controller;

a user-configured selection of optional function modules comprising a plurality of such modules received in selection ones of said connection sites, each of said optional function modules being adapted to be controlled by the controller in the performance of predetermined specific circuit testing operations and including means to enable the function module type, as regards its functional capability, to be determined by the controller;

connector means for coupling said plurality of function modules to an electronic circuit to be tested; and a bus structure interconnecting said plurality of function module connection sites with each other and with said programmable controller in a shared resource arrangement providing for direct module-to-module communication, said bus structure comprising:
  (i) a computer data bus for communicating control data from the controller to the function modules for controlling the operation of the function modules and for passing digital data to and from the function modules; and
  (ii) analog stimulus nd analog measurement buses enabling the sharing of analog resources within the automatic test equipment by direct communication between function modules received in said connection sites of analog stimulus and response signals.

48. Automatic test equipment as claimed in claim 47, said bus structure further comprising a synchronization bus comprising a plurality of sync/digital common lines for enabling direct module-to-module communications for cross-synchronization of events occurring within the automatic test equipment.

49. Automatic test equipment for the functional testing of electronic circuits, said automatic test equipment comprising:

a programmable controller comprising a digital computer having keyboard and display facilities;

first means for the connection to said programmable controller of a number of testing devices such as power supplies and external specialist instrumentation;

second means for the connection to said programmable controller of a user configured number of optional testing devices, said second means comprising a plurality of function module connection sites provided in the automatic test equipment with each of said connection sites being capable of receiving any one of plurality of different function modules of predetermined type designed to be controlled by the controller;

a user-configured selection of optional function modules comprising a plurality of such modules received in selected ones of said connection sites, each of said optional function modules being adapted to be controlled by the controller in the performance of predetermined specific circuit testing operations and including means to enable the function module type, as regards its functional capability, to be determined by the controller;

connector means for coupling said plurality of function modules to an electronic circuit to be tested; and a bus structure interconnecting said plurality of function module connection sites with each other and with said programmable controller in a shared resource arrangement providing for direct module-to-module communication, said bus structure comprising:
  (i) a computer databus for communicating control data from the controller to the function modules for controlling the operation of the function modules and for passing digital data to and from the function modules; and
  (ii) a synchronization bus comprising a plurality of sync/digital common lines for enabling direct module-to-module communication for cross-synchronization of events occurring within the automatic test equipment.

* * * * *